US012068589B2

(12) United States Patent
Rostron et al.

(10) Patent No.: US 12,068,589 B2
(45) Date of Patent: Aug. 20, 2024

(54) ARRESTER PERFORMANCE MONITORING AND MAINTENANCE SYSTEM

(71) Applicant: Southern States, LLC, Hampton, GA (US)

(72) Inventors: Joseph R Rostron, McDonough, GA (US); Rajesh Anand, McDonough, GA (US); Jiyuan Fan, Duluth, GA (US)

(73) Assignee: SOUTHERN STATES, LLC, Hampton, GA (US)

( * ) Notice: Subject to any disclaimer, the term of this patent is extended or adjusted under 35 U.S.C. 154(b) by 43 days.

(21) Appl. No.: 17/978,185

(22) Filed: Oct. 31, 2022

(65) Prior Publication Data
US 2024/0146047 A1 May 2, 2024

(51) Int. Cl.
| | |
|---|---|
| H02H 1/00 | (2006.01) |
| H01C 7/12 | (2006.01) |
| H02G 13/00 | (2006.01) |
| H02H 1/04 | (2006.01) |
| H02H 3/22 | (2006.01) |
| H02H 9/06 | (2006.01) |

(52) U.S. Cl.
CPC ............ *H02G 13/60* (2013.01); *H01C 7/12* (2013.01); *H02G 13/80* (2013.01)

(58) Field of Classification Search
CPC .......... H02G 13/60; H02G 13/80; H01C 7/12
USPC ........................................................ 361/117
See application file for complete search history.

(56) References Cited

U.S. PATENT DOCUMENTS

| | | | | |
|---|---|---|---|---|
| 2016/0161547 A1* | 6/2016 | Farquhar, III | ......... | G01K 13/00 324/549 |
| 2020/0021184 A1* | 1/2020 | Frampton | .............. | H02H 9/042 |
| 2022/0357388 A1* | 11/2022 | Koch | .................... | G01R 31/14 |

* cited by examiner

*Primary Examiner* — Jared Fureman
*Assistant Examiner* — Lucy M Thomas
(74) *Attorney, Agent, or Firm* — Mehrman Law Office; Michael J. Mehrman

(57) ABSTRACT

A system or method for monitoring an electric power lightning arrester including an arrester current sensor providing an arrester current measurement, and an arrester voltage sensor providing an arrester voltage measurement. The system detects a switching signature based on the arrester current measurement or the arrester voltage measurement distinguished from background noise and lightning signatures and computes a measured arrester impedance based on the arrester current and arrester voltage measurements. The system then compares the measured arrester impedance to a nominal or historical arrester impedance, determines that the arrester is faltering based on the comparison of the measured arrester impedance to the nominal or historical arrester impedance, and places an order for replacement of the arrester based on the determination that the arrester is faltering. The system operator then replaces the arrester during a fair-weather, typically off-peak period to avoid failure of the arrester during a lightning strike.

20 Claims, 17 Drawing Sheets

ARRESTER PERFORMANCE MONITORING AND MAINTENANCE SYSTEM

REFERENCE WITHOUT PRIORITY CLAIM TO RELATED APPLICATIONS

This application is an improvement upon, without claiming priority to, commonly owned U.S. patent application Ser. No. 17/382,419 filed Jul. 22, 2011; which claims priority to U.S. patent application Ser. No. 15/788,520 filed Oct. 19, 2017; which claims priority to U.S. Provisional Application Ser. No. 62/410,262 filed on Oct. 19, 2016, which are incorporated by reference.

TECHNICAL FIELD

The present invention is directed to electric power systems and, more particularly, to an electric power arrester performance monitoring and maintenance system utilizing arrester current and voltage measurements to detect changes in arrester impedance during switching disturbances indicating faltering arrester performance and scheduling replacement of the faltering arrester.

BACKGROUND

A voltage surge arrester is a device used on electric power systems to protect the insulation and conductors of the system from the damaging effects of switching and other transient voltage surges. An arrester is typically located in the supply side of a protected load, such as a piece of equipment or distribution segment, to protect the load from voltage surges. The arrester includes an internal voltage-variable resistor known as a "varister" that conducts an electric current when the voltage across the arrester reaches a certain voltage to effectively limit the voltage experienced by the protected load to that voltage. A failed arrester behaves like an open circuit exposing the protected load to transient voltage surges without the protective voltage limiting effect of the arrester.

Arrester failures are among the most common causes of power outages in electric transmission and distribution systems. Although arrester failure may result from a number of causes, an increase in the internal temperature of the arrester often provides an early warning of impending failures. This is because increasing leakage current through the arrester creates heat that tends to build up until complete failure occurs. Arrester failure can cause local voltage overloads resulting in faults on the system that must be isolated and cleared. Most commonly, arrester failure results in local power outages and lost service to customers as well as expensive field service crews to replace the arrester to return the network to full service.

Conventional maintenance practices involve periodic arrester monitoring with heat detecting infrared (IR) cameras. This is time consuming, difficult because a temperature difference of only a few degrees difference can be an early indication of impending arrester failure. This is problematic because this level of temperature difference is so low that solar heating and other ambient conditions can mask real problems and trigger "false alarm" arrester replacement. This problem is acerbated by the fact that the vast majority of arrester failures result from moisture getting into the arrester housing, which shorts out several varister blocks causing sustained overvoltage on the other blocks. It is difficult, of course, to conduct arrester monitoring during severe when the electric distribution system experiences the highest level of lightning strikes and weather related outages. Even aggressive monitoring during fair weather therefore fails to detect the most common causes of arrester failure. Arresters therefore continue to be a major cause of unplanned outages and transient voltage related power quality events requiring repair activities at any time of day or night. There is, therefore, a need for a more effective approach for electric power voltage arrester monitoring and replacement.

SUMMARY

The present invention may be embodied in a system or method for monitoring an electric power lightning arrester including an arrester current sensor providing an arrester current measurement, and an arrester voltage sensor providing an arrester voltage measurement. The system detects a switching signature based on the arrester current measurement and/or the arrester voltage measurement distinguished from background noise and lightning signatures. The system computes a measured arrester impedance based on the arrester current and arrester voltage measurements, and compares the measured arrester impedance to a nominal or historical arrester impedance. The system determines that the arrester is faltering based on the comparison of the measured arrester impedance to the nominal or historical arrester impedance, and places an order for replacement of the arrester based on the determination that the arrester is faltering. The system operator then replaces the arrester during a fair-weather, typically off-peak period to avoid failure of the arrester during a lightning strike.

In a representative embodiment, the arrester current sensor is located within an insulator housing of the arrester. For example, the arrester current sensor may be positioned around an inner core within the insulator housing of the arrester. In another embodiment, the current sensor is positioned around a central bolt external to the insulator housing. In addition, the arrester voltage sensor may include an inner voltage gradient and an outer voltage gradient electrode adjacent to an insulator housing of the arrester. In another embodiment, the arrester voltage sensor includes a voltage sensor signal tap positioned on a canister of a transformer protected by the lightning arrester.

The system may also include a remote transmission unit (RTU) a communication link transmitting the arrester voltage measurement from the voltage sensor to the RTU. Similarly, a communication link system transmits the arrester current measurement from the current sensor to the RTU. The system may also include an operations control center and a communication link transmitting the arrester voltage measurement and the arrester current measurement, or a parameter based on the arrester voltage and current measurements, from the RTU to the operations control center. Either the RTU or the operations control center may determine that the arrester is faltering based on the comparison of the measured arrester impedance to the nominal or historical arrester impedance and place an order for replacement of the arrester based on the determination that the arrester is faltering. The measured arrester impedance may be adjusted based on a present arrester temperature measurement. The system operator then replaces the faltering arrester during a fair-weather, typically off-peak period to prevent the faltering arrester from failing during a lightning strike causing damage to equipment protected by the lightning arrester.

Another embodiment includes a temperature sensor/transmitter for an electric power voltage surge arrester, an associated instrumented voltage surge arrester, and an associated operation and maintenance system. The electric power voltage surge arrester includes a temperature sensor, wireless transmitter, and a visual over-temperature indicator. There are several illustrative examples of the temperature sensor/transmitter including a disk shaped module configured to be placed between varistor blocks inside the arrester housing, a replacement varistor block containing the sensor/transmitter, and a strap-on module configured to be attached to the outside of the arrester housing. The sensor/transmitter may utilize a harvesting power supply that draws electric power for the electronics from the power line protected by the arrester. The sensor/transmitter may also utilize an ambient temperature sensor to enhance accuracy of its temperature measurements.

The temperature sensor/transmitter typically sends arrester monitoring data wirelessly to a remote transmission unit (RTU) or handheld unit located outside the arrester, which relays the monitoring data to an operations control center that schedules replacement of the arrester based on the monitoring data. The sensor/transmitter may also implement a dynamic data transmission cycle that automatically adjusts to the time required to harvest transmission power.

The instrumented electric power voltage arrester or an associated device may also include a surge counter configured to count a number of temperature surges experienced by the arrester. The surge counter may also count a number of equipment related temperature surges and a number of lightning related temperature surges experienced by the arrester.

It will be understood that specific embodiments may include a variety of features in different combinations, as desired by different users. In view of the foregoing, it will be appreciated that the present invention provides a cost-effective lightning arrester monitoring and replacement system for an electric power distribution utility company. The specific techniques and structures for implementing particular embodiments of the invention and accomplishing the associated advantages will become apparent from the following detailed description of the embodiments and the appended drawings and claims.

BRIEF DESCRIPTION OF THE FIGURES

The numerous advantages of the invention may be better understood with reference to the accompanying figures in which.

DETAILED DESCRIPTION

Figure 1:
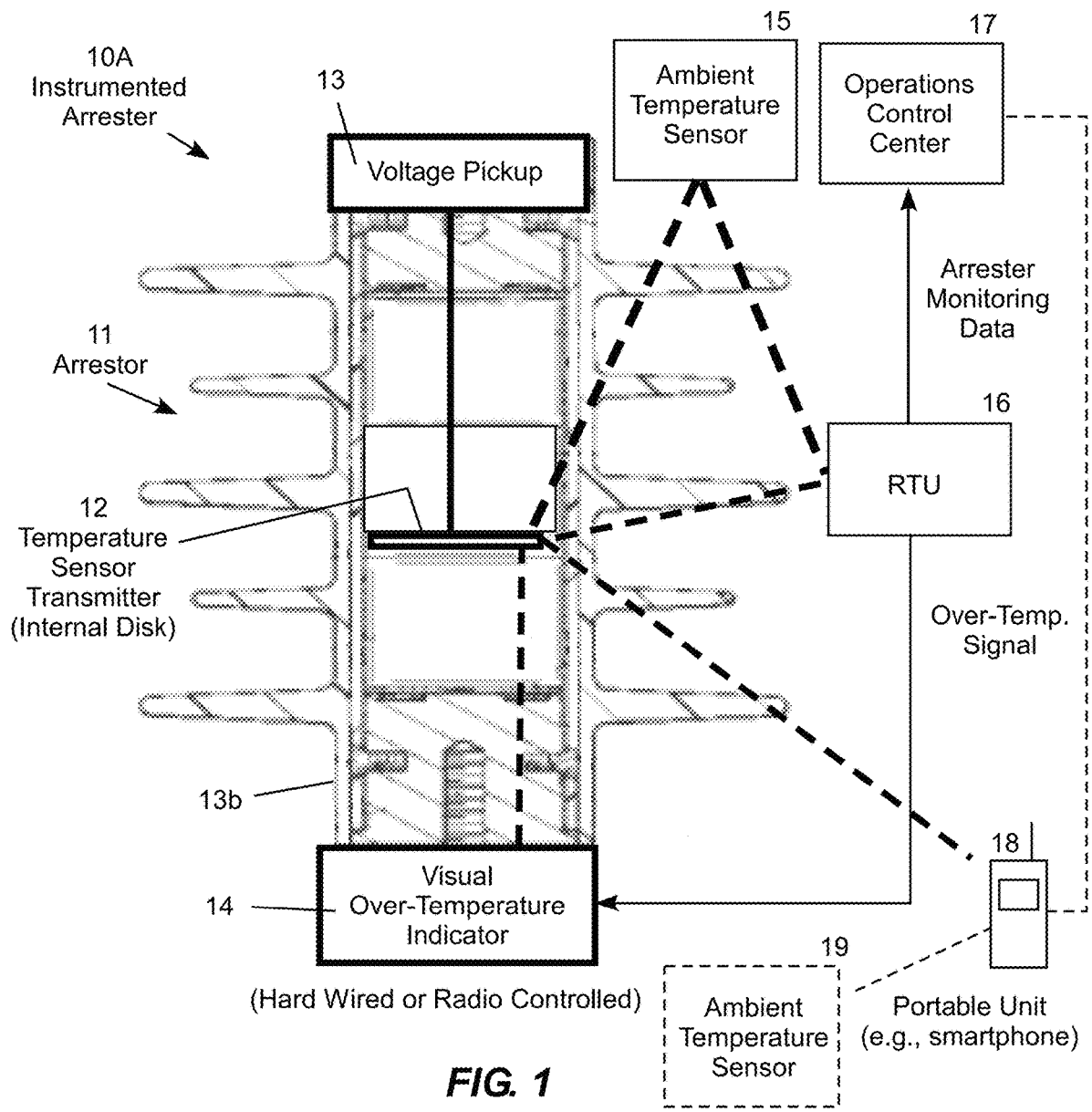
FIG. 1 is conceptual illustration of an instrumented electric power voltage arrester including an internal disk temperature transmitter/sensor.

Embodiments of the invention a system or method for monitoring an electric power lightning arrester including an arrester current sensor providing an arrester current measurement, and an arrester voltage sensor providing an arrester voltage measurement. The system detects a switching signature based on the arrester current measurement or the arrester voltage measurement distinguished from background noise and lightning signatures and computes a measured arrester impedance based on the arrester current and arrester voltage measurements. The system then compares the measured arrester impedance to a nominal or historical arrester impedance, determines that the arrester is faltering based on the comparison of the measured arrester impedance to the nominal or historical arrester impedance, and places an order for replacement of the arrester based on the determination that the arrester is faltering. The measured arrester impedance may be adjusted based on a present arrester temperature measurement. The system operator then replaces the arrester during a fair-weather, typically off-peak period to avoid failure of the arrester during a lightning strike.

Alternative embodiments include a temperature sensor/transmitter for an electric power voltage surge arrester, an associated instrumented voltage surge arrester, and an associated operation and maintenance system. The electric power voltage surge arrester provides a cost effective solution for continuously monitoring arrester temperature to detect an elevated risk of arrester failure. Autonomous continual monitoring helps to eliminate unexpected arrester failure and unnecessary replacements. Arresters are typically made of housings with a series of internal Zinc Oxide varister blocks in series from line voltage to ground. These varister blocks are the active elements that limit voltage surges on power systems. In various embodiments, a temperature sensor is added as a replacement block into the varister stack, a disk-shaped sensor positioned between varister blocks, or strapped to the arrester housing adjacent to the varister stack. The sensor includes a harvesting power supply that draws electricity to power the electronics from the power line and a wireless transmitter that communicates the arrester monitoring data to an external device, such as a remote transmission unit (RTU) or handheld interrogator. The RTU or handheld interrogator typically relays the arrester monitoring data on to an operations control center, which schedules replacement of the arrester as indicated by the arrester monitoring data. The arrester monitor may also utilize an ambient temperature monitor to help distinguish temperature variations due to leakage current from ambient temperature changes. A surge counter keeps track of the number of equipment and lightning related temperature surges experienced by the arrester.

It will be appreciated that wireless transmissions emanating from inside the central canister formed by the arrester housing are not blocked by the arrester housing (bells) because the housing is constructed from a non-conducting insulator material. Temperature sensors located inside the arrester housing may more precisely measure the actual temperature of the arrester blocks, while an external sensor may be more easily installed without taking the arrester out of service. Measuring ambient temperature helps to improve the accuracy of the external strap-on sensor.

The sensor block may be installed near the center of the arrester as the ends are frequently cooler because of the cooling that comes from the attachments for mechanically supporting the arrester assembly. The sensors typically harvest power for the electronics from voltage pickups located in the high voltage electric field produced by the power line. Other types of harvesting power supplies may be used, such those that induce electricity from an external RF energy beam or the magnetic field produced by the power line. Another option includes harvesting the trickle of current that normally passes through the internal varister stack of the arrester. Energy may also be harvested from the electrostatic field between the sensor to ground by virtue of capacitive coupling between a capacitive foil insulated from the sensor, which could be housed in a cylindrical puck.

The present invention may be embodied in an instrumented electric power voltage arrester including a temperature sensor, wireless transmitter, and a visual over-temperature indicator. There are several illustrative examples of the temperature sensor/transmitter including a disk shaped module configured to be placed between varister blocks inside the arrester housing, a replacement varister block containing the sensor/transmitter, and a strap-on module configured to be attached to the outside of the arrester housing. The sensor/transmitter may utilize a harvesting power supply that draws electric power for the electronics from the power line protected by the arrester. The sensor/transmitter may also utilize an ambient temperature sensor to enhance accuracy of its temperature measurements.

The temperature sensor/transmitter typically sends arrester monitoring data wirelessly to an RTU or handheld unit located outside the arrester, which relays the monitoring data to an operations control center that scheduled replacement of the arrester based on the monitoring data. The sensor/transmitter may also implement a dynamic data transmission cycle that automatically adjusts to the time required to harvest transmission power.

The visual indicator may resemble a bracelet placed around the arrester housing between the "weather sheds." This type of visual indicator can be easily installed over an existing arrester insulator. This bracelet may carry one or more patch antennas suitable for bidirectional RF communications and receiving power for the LED indicator lights. These patches can also be used to harvest energy from the electrostatic electrical field. A bracelet placed on the arrester insulator without other connections will be electrically "floating." Since the top of the arrester is at line voltage and the bottom is at ground, the bracelet will be closely coupled to the power line voltage gradient with an intermediate voltage related to the point on the arrester where the bracelet is placed. This will cause capacitive currents through the housing insulation predominated by the voltage of the arrester at the point where the arrester is located. The stray capacitance to ground will cause a slight shift in this voltage but since this is not a voltage monitor, it will not cause any undesirable issue. Alternatively, energy can be scavenged by having two partially circumferential rings under the edges of this bracelet and using the voltage difference between them to provide sensor power. This uses the voltage gradient along the internal arrester blocks to provide a differential voltage between these rings. These rings will be capacitive coupled to the arrester at the local voltage where the sensor in mounted. This has the advantage of being in close proximity to the arrester where it is easier to obtain the needed energy. With this approach, the bracelet can be placed near the bottom of the arrester where the LED's or other visible indicator allowing technicians in the field to easily see which arrester is indicating a problem.

The arrester monitoring data from these sensors is collected periodically to measure temperature differences, trends and rapidly changing conditions. From this information, an arrangement of measurements and other data can be utilized to schedule maintenance and provide alarms and indications of impending equipment failures. This information is collected by the multiple arresters to uniquely identify specific arresters for careful monitoring and replacement at a time when they can be replaced with minimal disruption to customer service. This allows scheduled arrester replacement based on continual temperature monitoring rather than emergency replacement driven by arrester failure.

The temperature sensor may be a resistance temperature detector (RTD), surface acoustic wave (SAW), thermocouple, or any other suitable type of temperature sensor. RTD sensors are accurate and inexpensive, while SAW sensors are passive devices having the advantage of requiring no power to sense temperature. A SAW sensor can is typically read when illuminated by a signal from a reader, which receives and interprets energy reflected from the sensor. The antenna/sensors may have a unique identity code built into the sensor for identification of the sensor and associated arrester. Powered arrangements can harvest energy to run active transmitters and use thermocouples, RTD or other approaches to sense the temperature.

FIG. 1 is conceptual illustration of an instrumented electric power voltage arrester 10A including an arrester 11 carrying an internal disk temperature sensor/transmitter 12 powered by a voltage pickup 13 that harvests electricity from the electric power line 5 protected by the arrester. The sensor/transmitter 12 communicates wirelessly through a wired link with a visual over-temperature indicator 14 that illuminates light-emitting diodes (LEDs) to indicate a detected over-temperature condition. The instrumented electric power voltage arrester may also utilize an ambient temperature sensor 15 to enhance the detection of a temperature change detected by the sensor/transmitter 12 caused by an increase in leakage current through the arrester as opposed to changes in the ambient temperature. The sensor/transmitter 12 communicates arrester monitoring data to an external device, in this example a remote transmission unit (RTU) 16, which relays data to an operations control center 17 that schedules maintenance including replacement of the arrester when indicated by the arrester monitoring data. The sensor/transmitter 12 may also communicate with a portable unit 18, such as a smartphone or similar portable device, which relays the operations control center 17. The portable unit 18 may include its own ambient temperature sensor 19.

The sensor/transmitter 12 continually supplies the control center 17 with arrester monitoring data allowing the control center to detect impending arrester failure presaged by a detected increase the temperature of the arrester. This allows arrester replacement to be planned and scheduled during a fair-weather, typically off-peak, nighttime or weekend period without waiting for the arrester to fail unexpectedly during a lightning strike. In addition to providing continual autonomous temperature monitoring, the temperature sensor/transmitter 12 which is physically connected to the arrester 11 provides improved accuracy over conventional infrared (IR) readers used to occasionally measure the arrester temperature from a distance. This reduces the occurrence of "false alarm" replacement of properly functioning arresters. False alarms are a persistent problem with conventional arrester maintenance because a relatively low temperature change caused by leakage current through the arrester, in the range of three degrees Celsius, typically indicates an increased risk of failure. This relatively small temperature difference can be easily triggered or masked by solar heating, rain, wind or other ambient conditions.

The arrester 11 includes a hollow cavity filled with a stack of varister blocks separated insulator spacers electrically connected between the protected power line 5 and electric ground 6. Many arresters can be opened to remove and replace the varister blocks, which are typically stacked on a central tube and compressed together with a spring. The disk-type temperature sensor/transmitter 12 in this embodiment, with a size that is similar to a spacer, is configured to be positioned within the varister stack either instead of or in addition to a spacer. This configuration allows the disk-type temperature sensor/transmitter 12 to be built into an arrester as original equipment, or as a retrofit component added to a pre-existing arrester. In addition, the arrester may contain multiple disk-type temperature sensor/transmitters, for example between every other varister block such that at least one sensor/transmitter is positioned adjacent to each varister block. This may be an advantageous configuration because each varister block can fail independently of the other blocks.

There are a number of electric power harvesting techniques available to power the electronics of the sensor/transmitter because the arrester is located in the high voltage electro-magnetic field of the power line with a large voltage gradient across the arrester from line potential at the power line 5 at the top of the arrester to electric ground 6 at the bottom of the arrester. For example, the voltage pickup 13 may include two electrodes spaced apart radially (horizontal on FIG. 1) or laterally (vertical on FIG. 1). In either case, electrodes separated by only a few centimeters in the high voltage gradient experienced by the arrester (e.g., 34.5 kV, 69 kV) is sufficient to harvest a few Volts sufficient to power the electronics of the sensor/transmitter (e.g., 5 Volts). The voltage pickup, which may be located in any desired position on the arrester, is depicted attached near the end of the arrester for illustrative convenience. For example, the voltage pickup may be positioned on the outside of the arrester housing 7 adjacent to the sensor/transmitter 12. The voltage pickup may be positioned on the sensor/transmitter 12 as a self-contained harvesting power supply to avoid the need for a wired connection from the voltage pickup to the sensor/transmitter. Configuring the sensor/transmitter 12 with a self-contained harvesting power supply and wireless transmitter provides an important advantage by avoiding the need for wired connections from external components to the sensor/transmitter.

The visual over-temperature indicator 14 can communicate with the sensor/transmitter 12 through a wired or wireless link, either directly or indirectly (e.g., through the RTU 16). As a result, the visual indicator may be positioned in any suitable position on or off the arrester 11. While the bottom of the arrester is a convenient and intuitive location for technicians visually inspecting the arrester, the visual indicator could be located on a control panel, transmitted to a remote unit, or any other suitable location. While any type of visible, audible or other indicator may be used, LEDs are durable, low power, inexpensive and well suited for this purpose. The indicator may be attached to the arrester in any suitable way. For example, one option is a resilient band that can be twisted or stretched to fit onto the arrester. Another option is a two-piece bracelet style with a hinge and hasp. Another option is a half-circle rigid band with eyelets on either end fastened to the arrester with a heavy-duty cable tie, Velcro strap or band clamp. Another option is two half-circle rigid bands that snap fit into each other. The indicator could also be configured on a stainless steel strap similar to the strap 91 for the sensor/transmitter shown in FIG. 9. A mechanism may be provided to tighten the strap, such as a band clamp or ratchet. Any other suitable attachment mechanism may be used as a matter for design choice.

The ambient temperature sensor 15 or 19 may be located in any suitable location that reliably represents the ambient temperature at the arrester 11. The sensor/transmitter 12 or other device that determines over-temperature alarm conditions may use the temperature measured by the sensor/transmitter independently, with respect to the detected temperature, or both. The temperature sensor/transmitter 12 shown in FIG. 1 located inside the arrester will be less sensitive to the ambient temperature than the external sensor/transmitter shown in FIGS. 9-11. An internal sensor/transmitter may therefore utilize the temperature measured by the sensor/transmitter independently, while an external sensor/transmitter may utilize the temperature measured by the sensor/transmitter with respect to the ambient temperature.

Distribution and transmission substations typically have preexisting RTUs as part of the Supervisory Control and Data Acquisition (SCADA) used by most electric utilities. The RTU 16 and the Operation and Control Center 17 may therefore be part of a preexisting SCADA system. As all of these components are functionally connected, the software that determines over-temperature alarms from the measured parameters may therefore be located in the sensor/transmitter 12, the visual indicator 14, the RTU 16, the Operation and Control Center 17, the portable unit 18, or any other suitable location. These components may be connected to each other through wired or wireless links, as desired. The portable unit 18 allows data collection from arresters outside of substations, such as locations along power lines, at tap points, transformers capacitors, voltage regulators, customer service points, and so forth.

Figure 2:
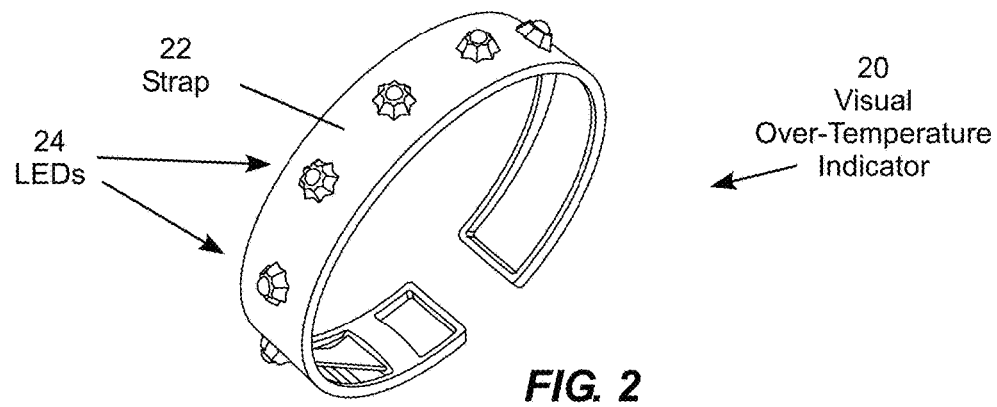
FIG. 2 is a conceptual illustration of a visual over-temperature indicator for the instrumented arrester.

FIG. 2 is a conceptual illustration of a visual over-temperature indicator 20 for the instrumented arrester. This particular example includes a strap 22 carrying a number of LEDs 24 and a wired connection or wireless receiver for communicating with a device supplying an over-temperature alarm signal, typically the sensor/transmitter 12 or the RTU 16. The bracelet-type indicator 20 can be easily attached to the outside of the arrester or a nearby location. The indicator 20 may receive power from the voltage pickup, the sensor/transmitter, the RTU, an onboard harvesting power supply, a battery, or any other suitable power source. In the embodiment shown in FIG. 1, a wired connection between the RTU 16 and the visual indicator 20 can provide both signal and power supply.

Figure 3:
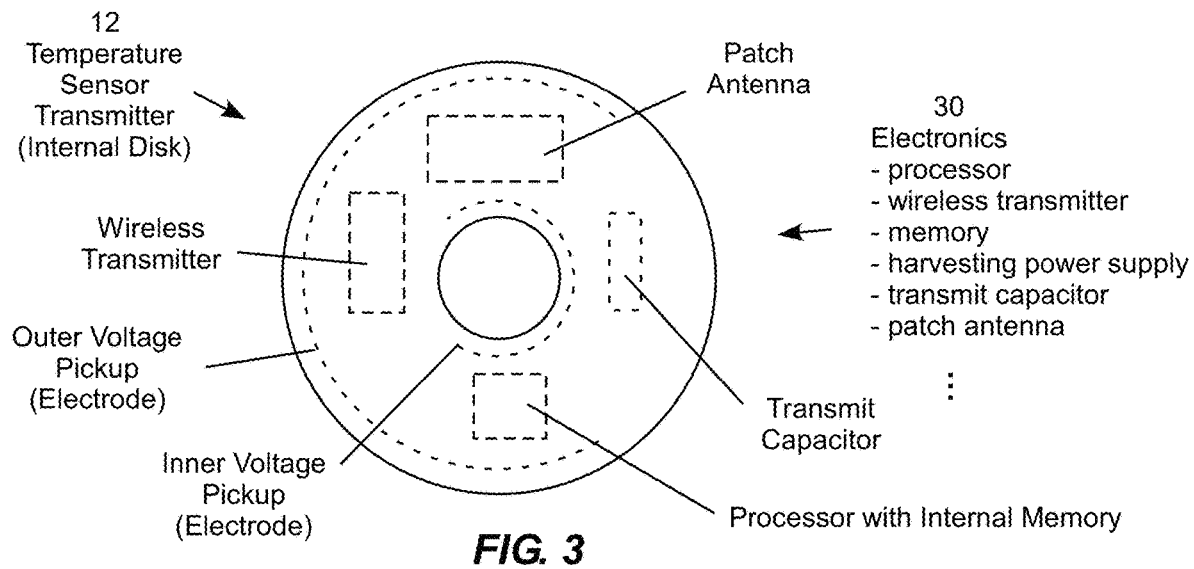
FIG. 3 is a conceptual top view illustration of the internal disk temperature transmitter/sensor.

FIG. 3 is a conceptual top view illustration of the internal disk temperature sensor/transmitter 12. The sensor/transmitter has a disk shape with a hole in the center allowing the disk to be received on the center tube of the arrester. The sensor/transmitter is similar in size to the spacer typically located between varister blocks in the stack contained within the arrester housing. The sensor/transmitter includes PC board with embedded electronics 30, typically including a processor, wireless transmitter, memory, harvesting power supply, transmit capacitor, patch antenna, and so forth. The harvesting power supply charges a transmit capacitor until it holds a sufficient charge to power a wireless data transmission.

Figure 4:
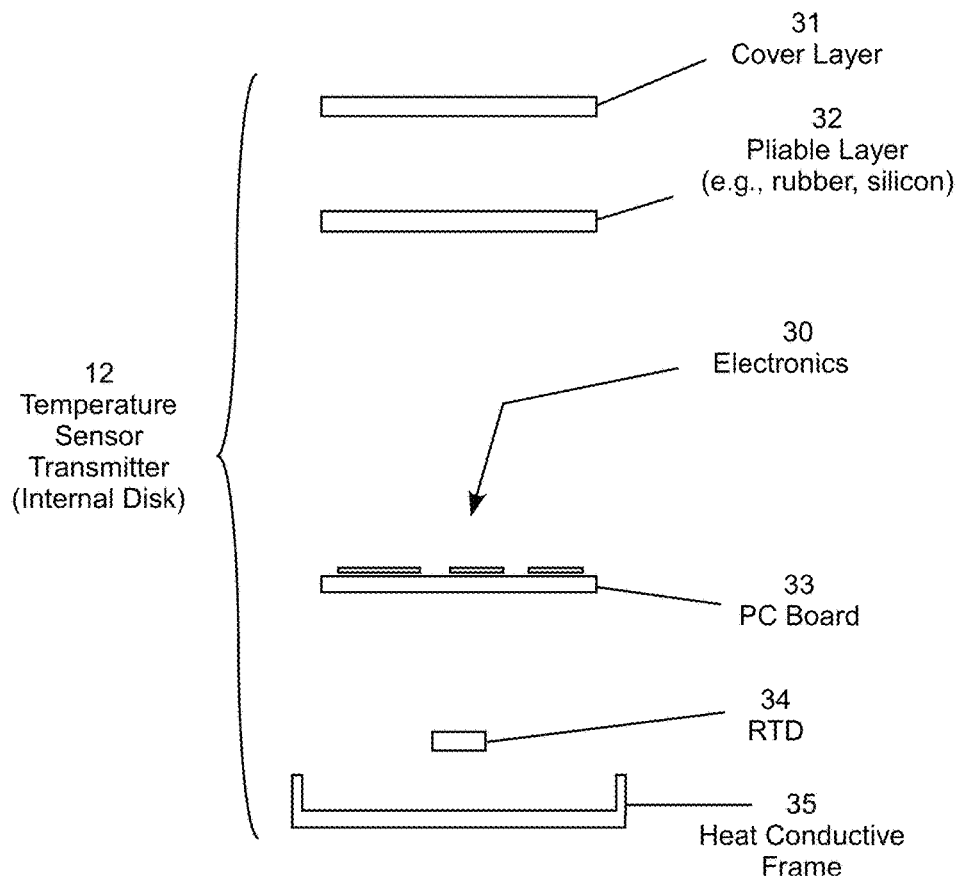
FIG. 4 is a conceptual exploded side view illustration of the internal disk temperature transmitter/sensor.

FIG. 4 is a conceptual exploded side view illustration of the internal disk temperature sensor/transmitter 12. The disk includes a cover layer 31 which may be a PC board, plastic or other dielectric material. A pliable layer 32 under the cover layer 31 protects the underlying PC board 33 carrying the electronics. A temperature sensor, such as a solid state resistance temperature detector (RTD) 34 is located between the PC board 33 and a heat conductive frame 35, such as an aluminum frame. The spring in the arrester stack compressing the varister stack also compresses the heat conductive frame 35 against the adjacent varister block for a reliable temperature reading by the RTD. While an RTD is utilized in this embodiment, other types of temperature sensors may be used, such as a surface acoustic wave (SAW) sensor, a thermocouple, or any other suitable thermal sensor.

Figure 5:
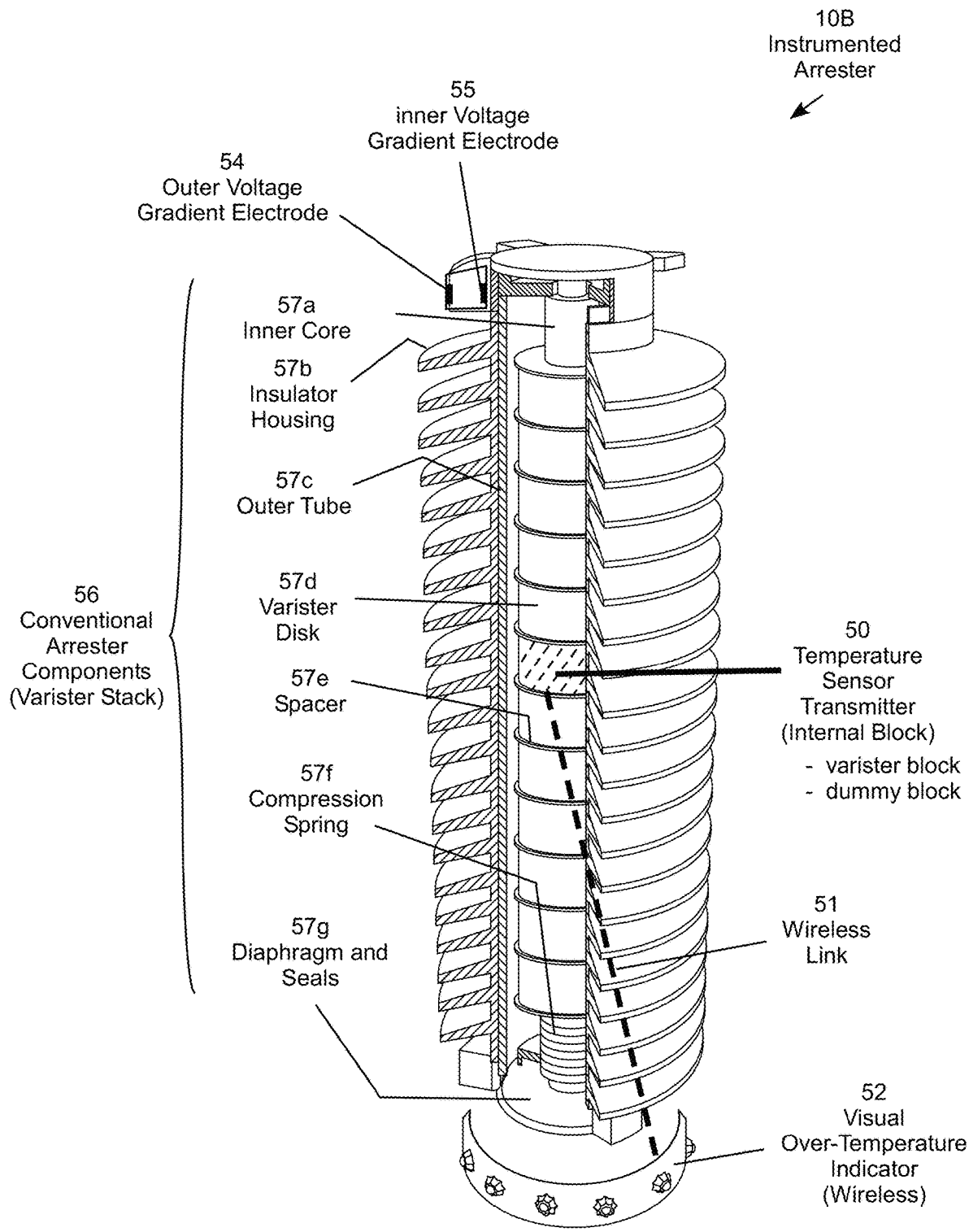
FIG. 5 is conceptual illustration of an instrumented electric power voltage arrester including an internal block temperature sensor with a wireless visual over-temperature indicator.

FIG. 5 is conceptual illustration of an instrumented arrester 10B including an internal block temperature sensor/transmitter 50 using a wireless link 51 to communicate with a visual over-temperature indicator 52. This embodiment is similar to the instrumented electric power voltage arrester 10A shown in FIG. 1, except that the disk-type sensor/transmitter 12 is replaced by the sensor/transmitter 50. This sensor/transmitter may be built into a varister block or an inoperative "dummy block" having a similar size as a varister block. This allows the internal block temperature sensor/transmitter 50 to replace a varister block or be added to the varsister stack inside the arrester. This example illustrates a voltage pickup including an outer voltage gradient electrode 54 radially spaced apart from an inner voltage gradient electrode 55. Some of the conventional components 56 of the arrester are also shown, including in the inner core 57a, insulator housing 57b, outer tube 57c, varister disks 57d, spacers 57e, the spring 57f compressing the varister stack, and the diaphragm and seals 57g at the bottom of the arrester.

Figure 6:
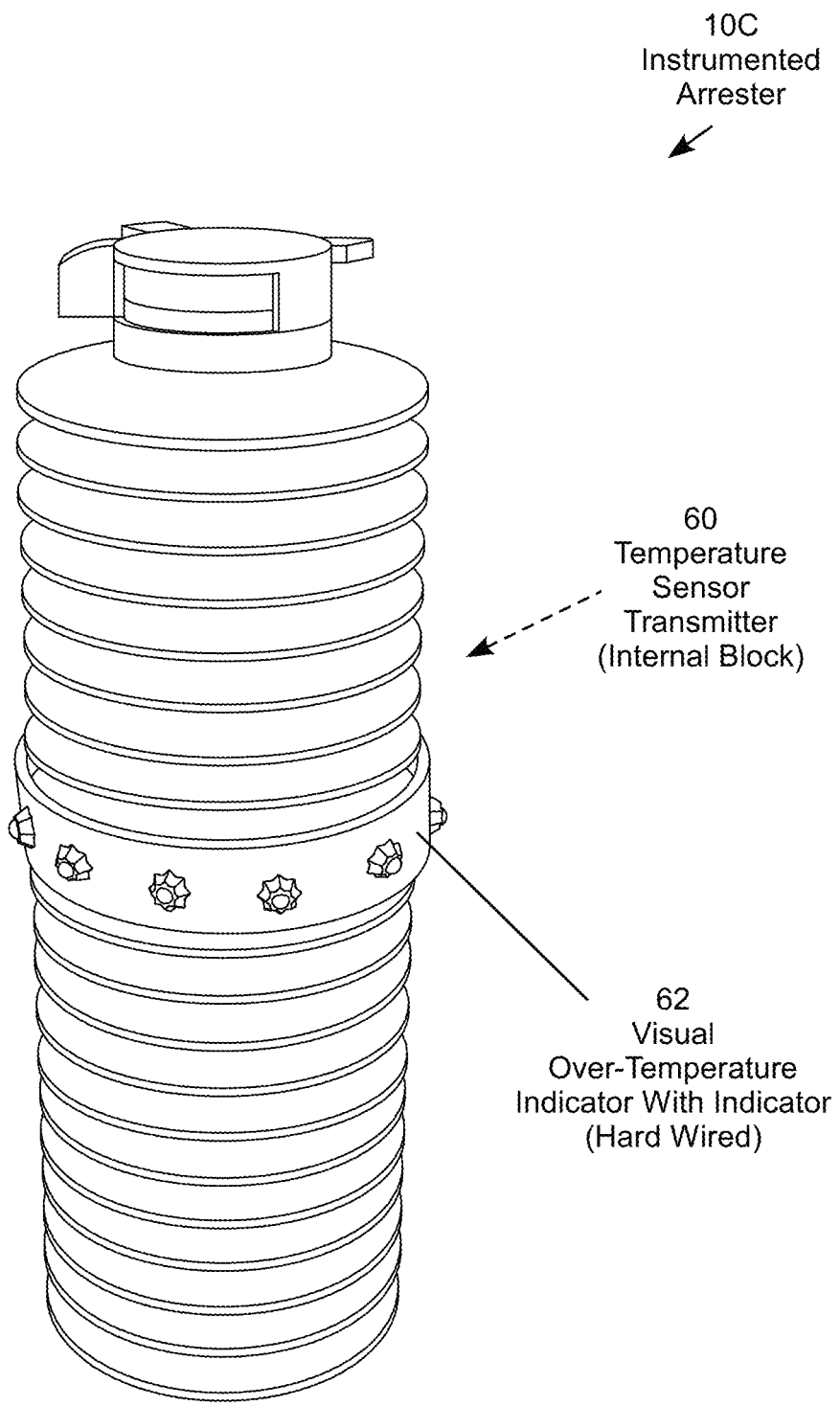
FIG. 6 is conceptual illustration of an instrumented electric power voltage arrester including an internal block temperature transmitter/sensor with a hard-wired visual over-temperature indicator.

FIG. 6 shows another alternative instrumented arrester 10C, in which the internal block sensor/transmitter 60 is hard-wired to the visual indicator 62. This configuration allows a harvesting power supply on the PC board of the sensor/transmitter to supply signal and electric power to the visual indicator.

Figure 7:
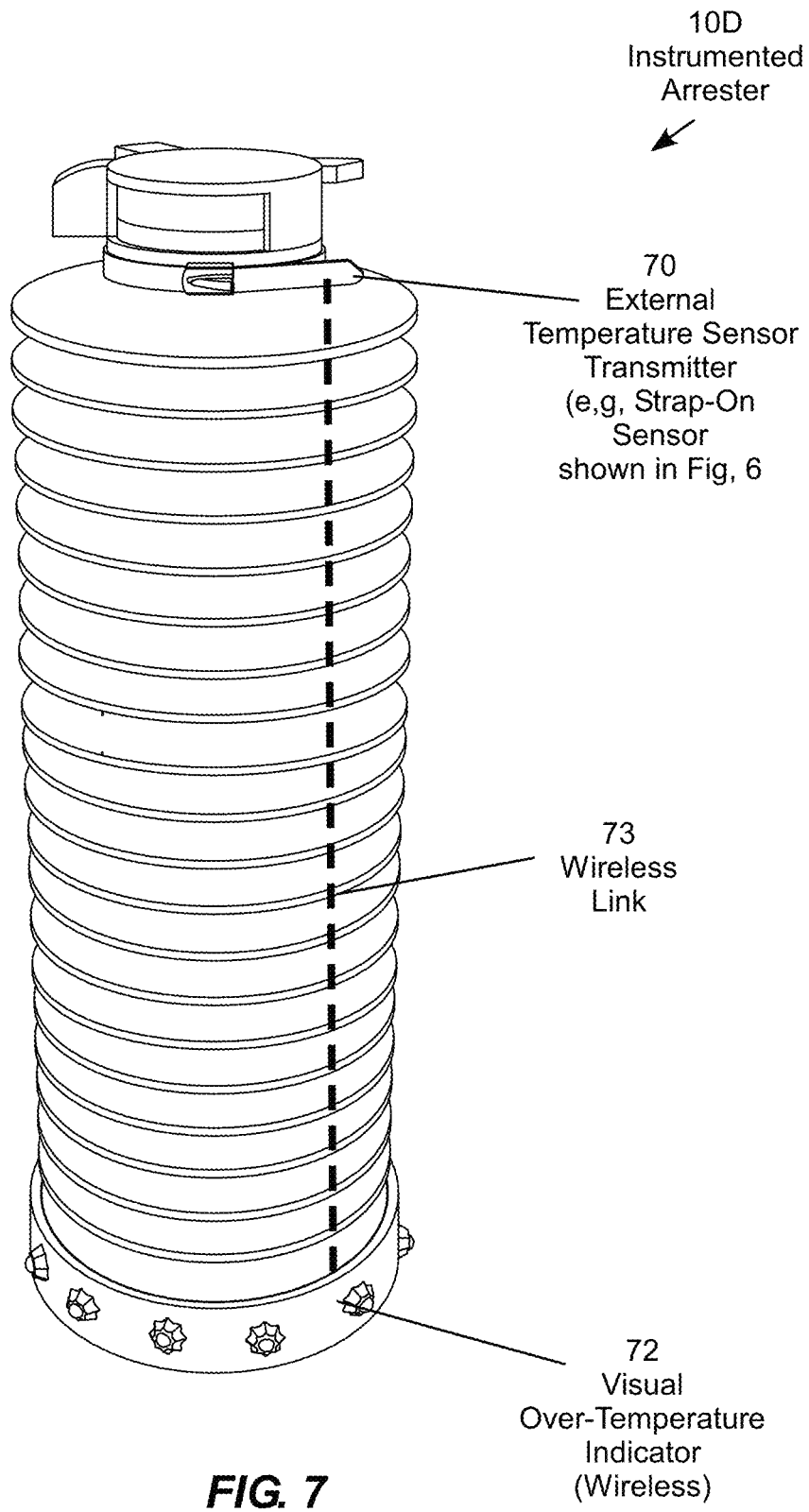
FIG. 7 is conceptual illustration of an instrumented electric power voltage arrester including an external strap-on temperature transmitter/sensor positioned near the end of an arrester.

FIG. 7 shows another alternative instrumented arrester 10D, which includes an external strap-on sensor-transmitter 70 that communicates with a visual indicator 72 over a wireless link 73. In this embodiment, the sensor-transmitter 70 and indicator 72 strap on at opposing ends of the arrester, which is convenient for adding these components to an existing arrester without having to take the arrester out of service.

Figure 8A:
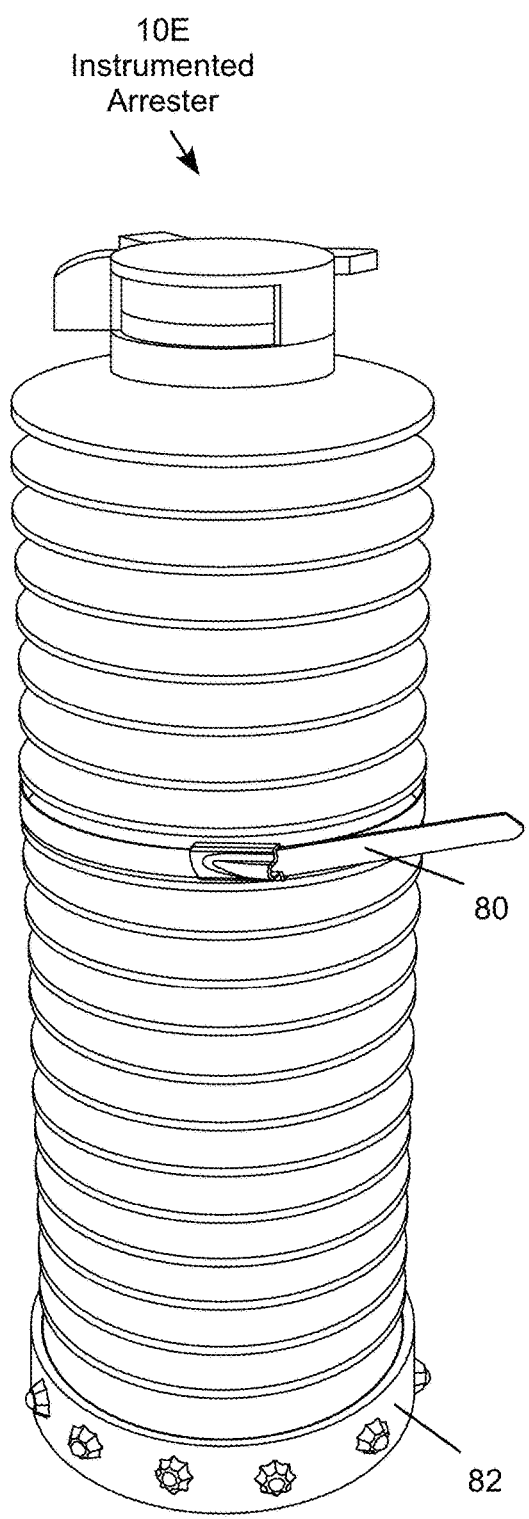
FIG. 8A is conceptual illustration of an instrumented electric power voltage arrester including an external strap-on temperature transmitter/sensor positioned near the center of the electric power voltage arrester.
Figure 8B:
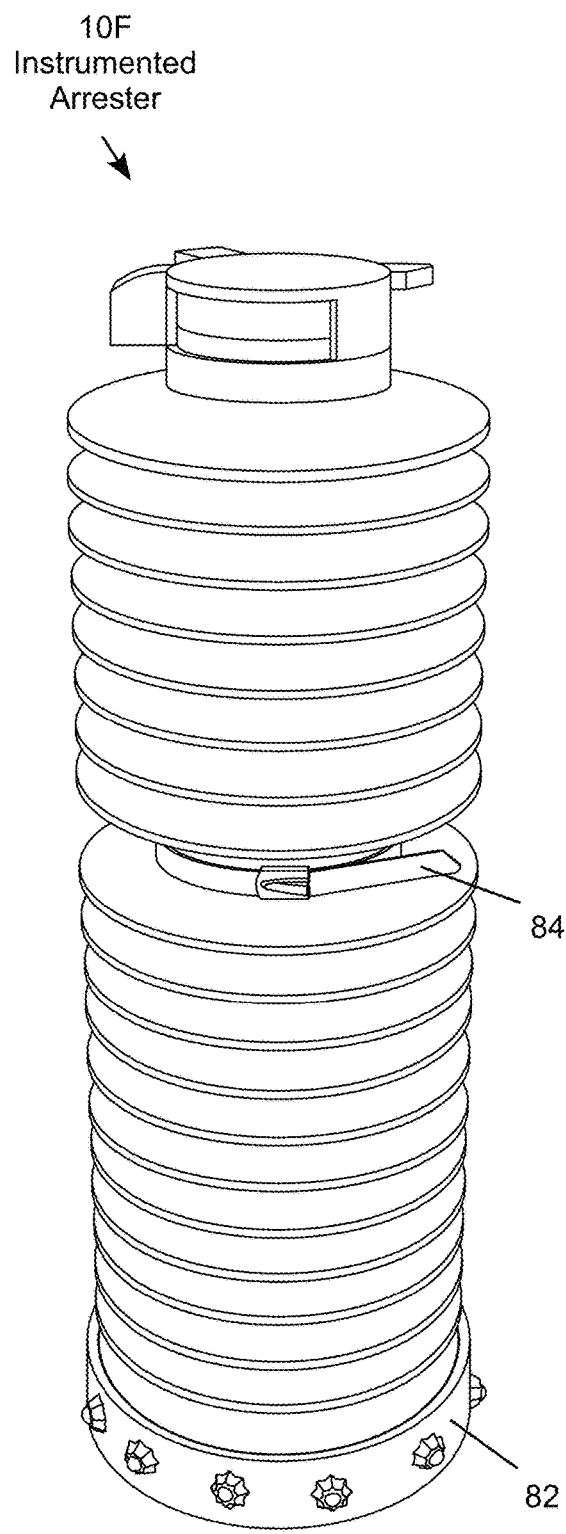
FIG. 8B is conceptual illustration of an alternative instrumented electric power voltage arrester including an external strap-on temperature transmitter/sensor positioned near the center of the electric power voltage arrester.

FIG. 8A shows another alternative instrumented arrester 10E that communicates with a visual indicator 82. In this embodiment, the strap-on sensor-transmitter 80 is attached at the center of the arrester, which may be a better location for detecting temperature increases caused by increases in the leakage current through the arrester. FIG. 8B shows another alternative where the arrester has a fin-free section near the center to accommodate an external sensor/transmitter 84 positioned closer to the varisters inside the arrester. The visual indicator and transmitter/sensor may be located in any desired position and communicate with the visual indicator wirelessly or through a wired connection, directly or indirectly, as a matter of design choice.

Figure 9:
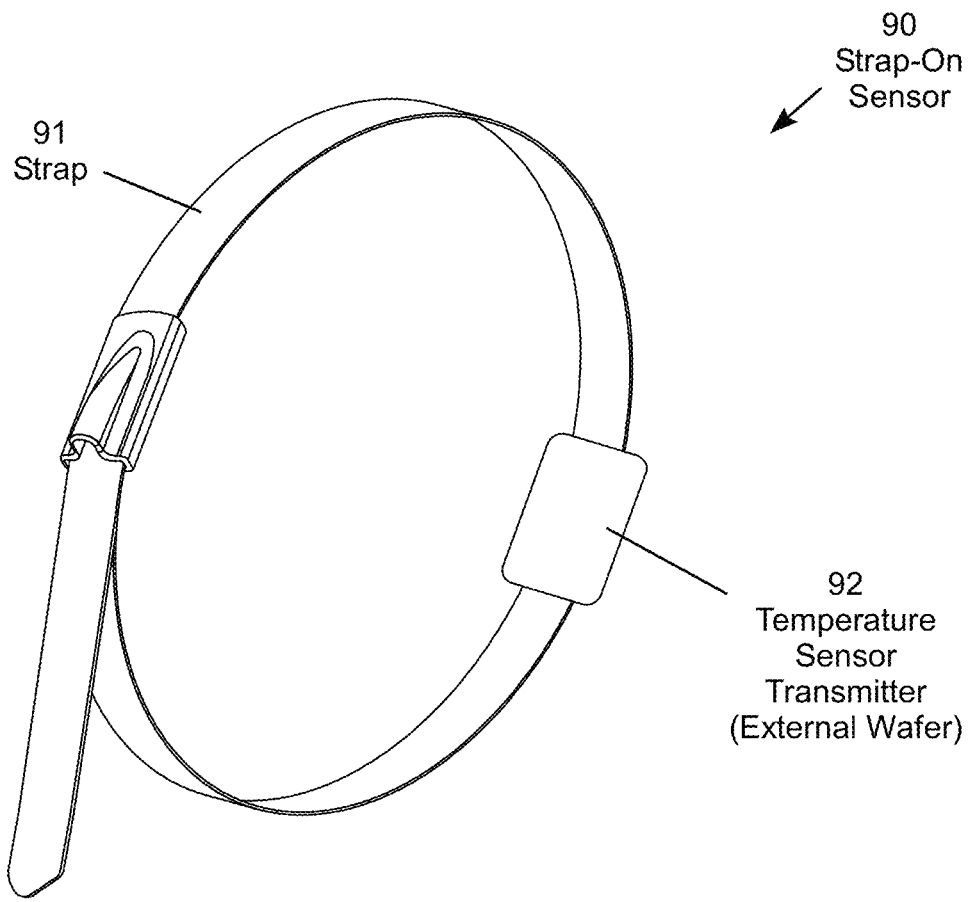
FIG. 9 is conceptual illustration of a strap-on transmitter/sensor for an electric power voltage arrester.

FIG. 9 is conceptual illustration of a strap-on temperature sensor 90 for an electric power voltage arrester. This particular embodiment includes a stainless steel strap 91 and a tag-style temperature sensor/transmitter 92 configured to be strapped onto the outside of the arrester. While the stainless steel strap 91 is depicted for this embodiment, any other suitable type of strap may be used as a matter of design choice. For example, one option is a resilient band that can be twisted or stretched to fit onto the arrester. Another option is a two-piece bracelet style with a hinge and hasp. Another option is a half-circle rigid band with eyelets on either end fastened to the arrester with a heavy duty cable tie, Velcro strap or band clamp. Another option is two half-circle rigid bands that snap fit into each other. A mechanism may be provided to tighten the strap, such as a band clamp or ratchet. Any other suitable attachment mechanism may be used as a matter for design choice.

Figure 10:
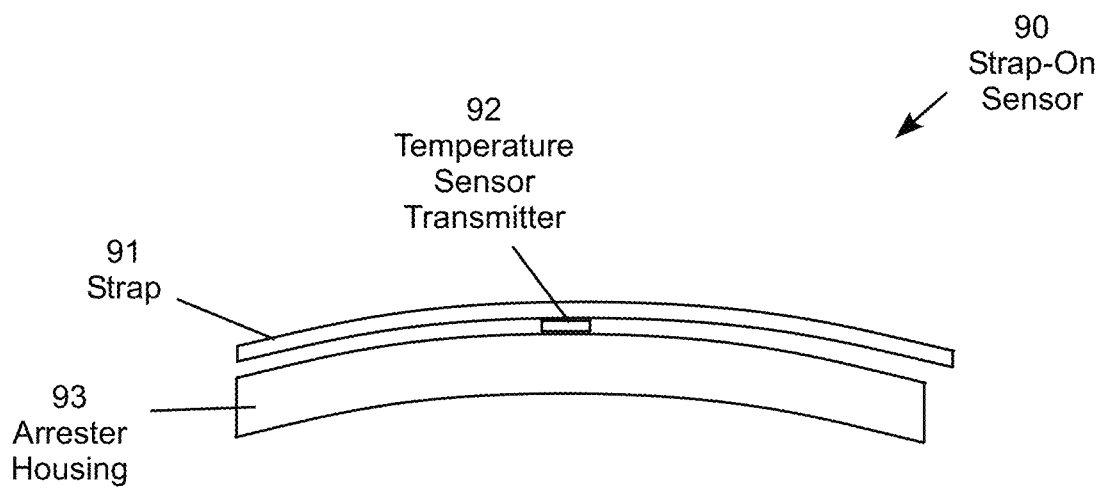
FIG. 10 is a conceptual side view of the strap-on transmitter/sensor.

FIG. 10 is a conceptual side view of the strap-on temperature sensor 90 connected to an arrester housing 93. The strap 91 holds the sensor/transmitter 92 firmly against the arrester housing 93 to ensure a reliable temperature measurement. A mechanism may be provided to tighten the strap, such as a band clamp or ratchet.

Figure 11:
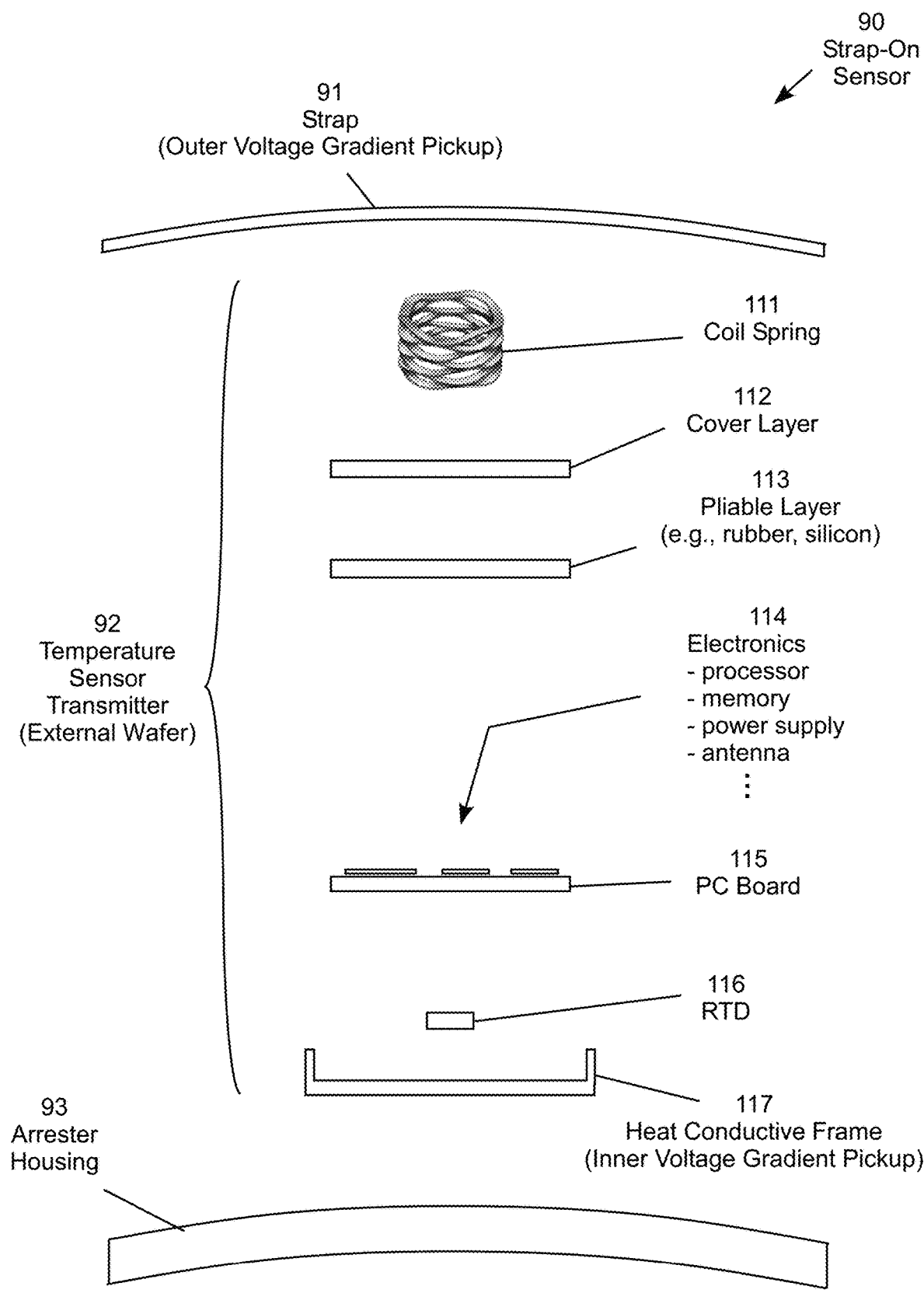
FIG. 11 is a conceptual exploded view of the strap-on transmitter/sensor.

FIG. 11 is a conceptual side exploded view of the strap-on temperature sensor 90 in which the stainless steel strap 91 holds the tag-style transmitter/sensor 92 in place. Unlike the embodiments that are located inside the arrester, this alternative may include a coil spring 111 to compress the sensor toward the arrester. Other compression devices may be used, such as replacing the band clamp with a stainless steel strap 91 or a strap with a ratchet. A plastic or other firm dielectric cover 112 is located under the coil spring 111 to distribute the compression pressure applied by the coil spring and keep ware out of the transmitter sensor. A pliable layer 113, such as rubber, neoprene or silicon, is located under the cover 112 to protect the underlying electronics. A PC board 115 carrying electronics 114 is located under the pliable layer 113. The electronics 114 typically include a processor, wireless transmitter, memory, harvesting power supply, transmit capacitor, patch antenna, and so forth. A temperature sensor, such as a resistance temperature detector (RTD), is located under the PC board 115. The temperature sensor may be an RTD, surface acoustic wave (SAW), thermocouple, or any other suitable type of temperature sensor. A heat conductive frame 117, such as an aluminum frame, is located under the temperature sensor. The coil spring 111 compresses the heat conductive frame 117 against the arrester housing 93 for a reliable temperature measurement.

Figure 12:
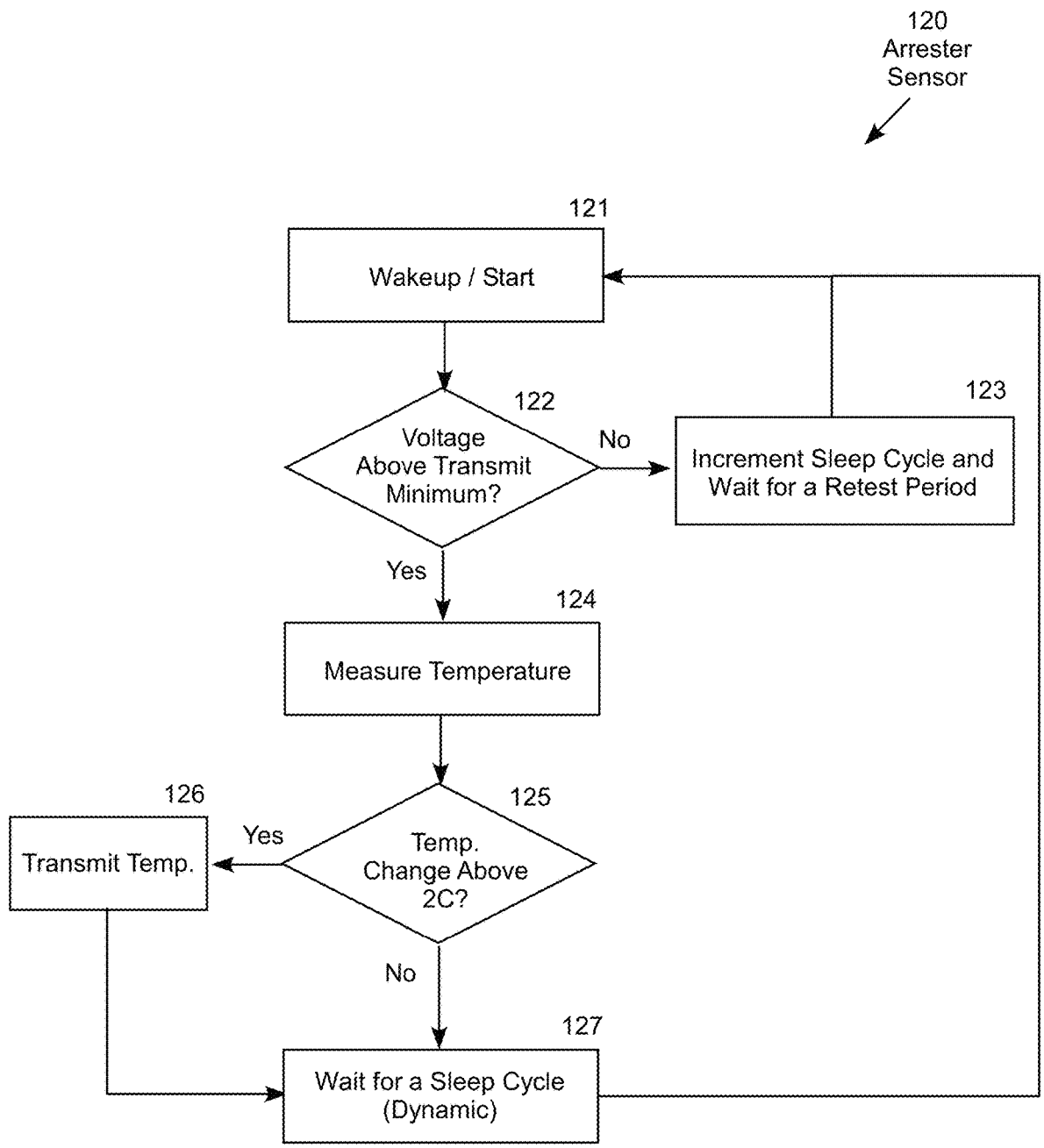
FIG. 12 is a logic flow diagram illustrating a method for operating a temperature transmitter/sensor for an electric power voltage arrester.

FIG. 12 is a logic flow diagram 120 illustrating a method for operating a temperature sensor/transmitter for an electric power voltage arrester. This routine dynamically sets the sleep cycle based on the experienced charging time of the transmit capacitor used to power short-burst wireless data transmissions. This allows the sensor/transmitter to automatically adjust to the performance of the harvesting power supply used to charge the transmit capacitor. In step 121, the sensor/transmitter starts or wakes up after a sleep cycle. Step 121 is followed by step 122, in which the sensor/transmitter determines whether the transmit capacitor has been charged up to a minimum transmission threshold. If the transmit capacitor has not been charged up to a minimum transmission threshold, the "No" branch is followed to step 123, in which the sensor/transmitter increments the sleep cycle so that that the transmit capacitor will charge for a longer period during the next cycle. For example, the sleep cycle increment may be set to ten percent (10%) of the previous sleep cycle setting or another duration as a matter of design choice. The sensor/transmitter then waits for a reset period before returning to step 121. The reset period may also be set to ten percent (10%) of the previous sleep cycle setting or another duration as a matter of design choice.

If the transmit capacitor has been charged up to a minimum transmission threshold, the "Yes" branch is followed from step 122 to step 124, in which the sensor/transmitter records a temperature measurement. Step 124 is followed by step 125, in which the sensor/transmitter determines whether the temperature change since the previous temperature measurement is above a preset threshold, such as two degrees Celsius (20C). If the temperature change since the previous temperature measurement is above the preset threshold, the "Yes" branch is followed to step 126, in which the sensor/transmitter transmits the measured temperature. If the temperature change since the previous temperature measurement is not above the preset threshold, the "No" branch is followed to step 127, in which the sensor/transmitter waits for a sleep cycle. Step 127 is followed by step 121, in which the sensor/transmitter wakes up for another transmit cycle.

Is should be noted that the temperature change in step 125 may be an independent measurement of the sensor/transmitter or a relative measurement of the sensor/transmitter with respect to the ambient temperature measurement. For example, sensor/transmitters located inside the arrester may use an independent temperature measurement, while sensor/transmitters located outside the arrester may use a relative temperature measurement. A weighted sum of the sensor/transmitter temperature measurement and the ambient temperature measurement, a temperature dependent scale of weighting factors, or another determined combination may be used based on calibration of the sensor/transmitter.

Figure 13:
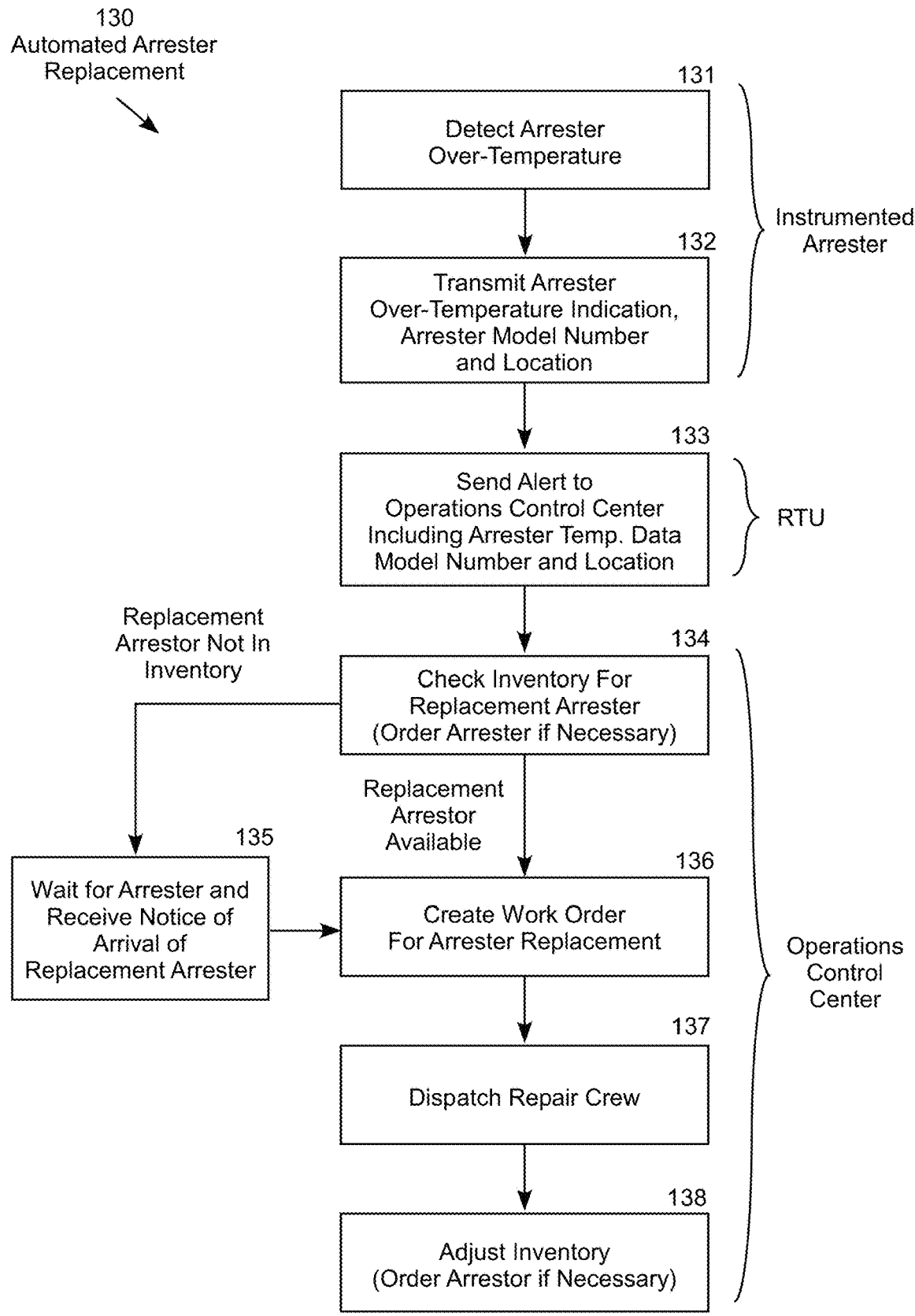
FIG. 13 is a logic flow diagram illustrating a method for scheduling replacement for an electric power voltage arrester.

FIG. 13 is a logic flow diagram 130 illustrating a method for scheduling replacement for an electric power voltage arrester, which may be performed in part by the sensor/transmitter, an RTU in communication with the sensor/transmitter, an operations control center, or any other suitable maintenance scheduling component in the electric power operations and maintenance system. Typically, the computations are distributed as shown in FIG. 13, but this distribution is merely illustrative as computer intelligence can be located in different components as a matter of design choice.

In step 131, the instrumented arrester detects an over-temperature condition. Step 131 is followed by step 132, in which the instrumented arrester transmits an over-temperature indication along with the arrester model number and location to the RTU. Step 132 is followed by step 133, in which the RTU sends an alert to the operations control center including the arrester model number and location. Step 133 is followed by step 134, in which the operations control center checks the inventory for a replacement arrester and orders a replacement arrester if necessary. If a replacement arrester has to be ordered, step 134 is followed by step 135, in which the operations control center waits for a notice of arrival of the replacement arrester. Steps 134 and 135 are followed by step 136, in which the operations control center creates a work order for replacement of the arrester. Step 136 is followed by step 137, in which a repair crew is dispatched to replace the arrester at a convenient time, such as an off-peak, night or weekend period. Step 136 is followed by step 137, in which the operations control center adjusts the inventory and orders a replacement arrester if appropriate.

Figure 14:
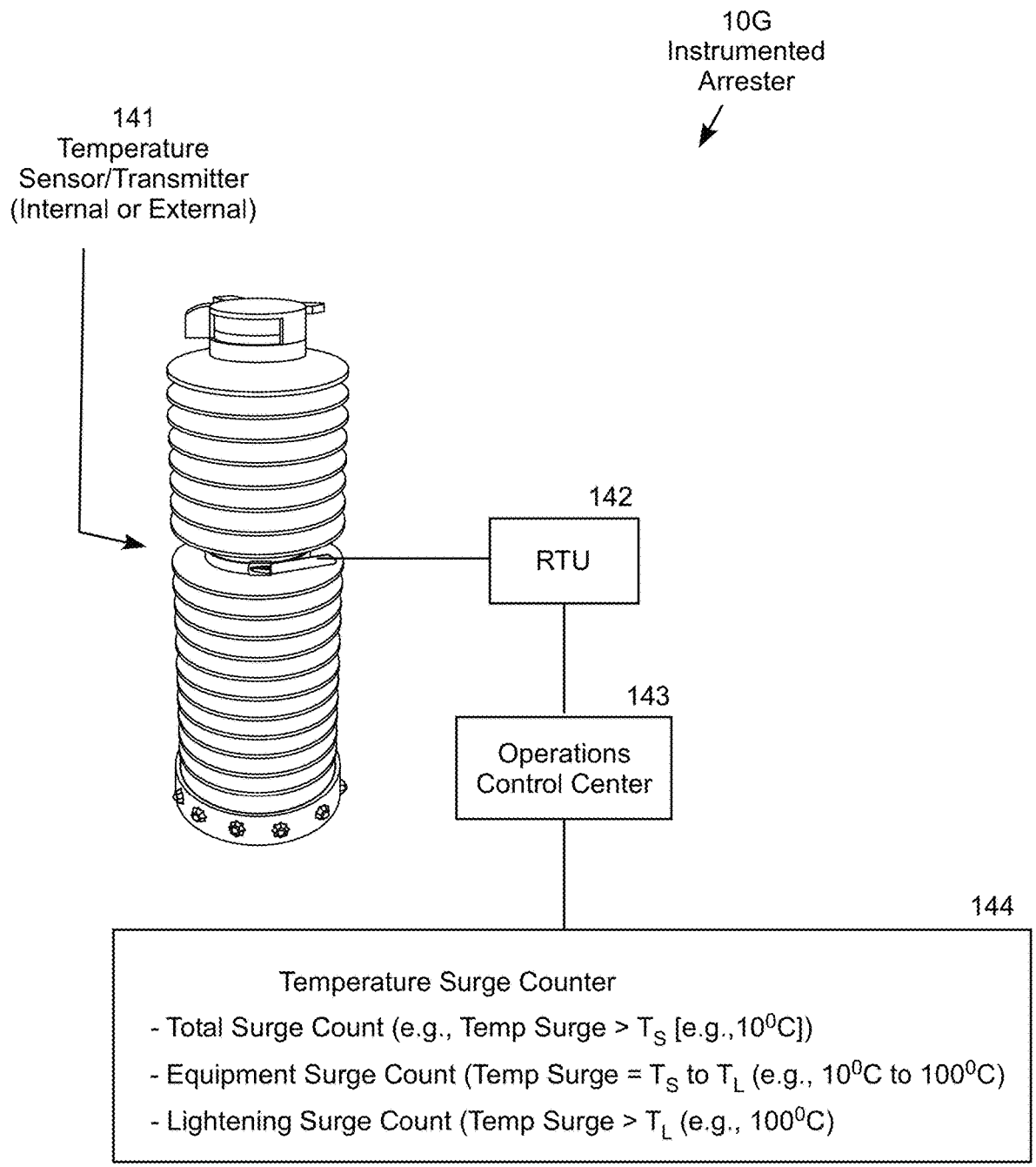
FIG. 14 is conceptual illustration of an instrumented electric power voltage arrester including a temperature transmitter/sensor and a surge counter.

FIG. 14 is conceptual illustration of an instrumented electric power voltage arrester 10G including a temperature transmitter/sensor 141 and a surge counter 144. In this example, the surge counter 144 is located in an operations control center 143 that receives the arrester monitoring data from the temperature transmitter/sensor 141 by way of an RTU 142. The RTU is located nearby the arrester, while the operations control center is located remotely and used for monitoring and controlling a large number of instrumented arresters throughout the system. This is merely one possible configuration, as the software for the surge counter can be located in any desired location, including the transmitter/sensor 141, the RTU 142 or any other desired location. Although an external transmitter/sensor 141 is depicted in FIG. 14, the surge counter 144 may be used with any type of internal or external transmitter/sensor. The transmitter/sensor communicates wirelessly with the RTU, which communicates with the operations control center 143 over a SCADA link. Wired, wireless and SCADA communication links may be utilized as a matter of design choice.

Conventional lightning counters utilize current measurements, which requires relatively expensive current sensors (known as current transformers or CTs) to be installed at each monitored arrester. The temperature transmitter/sensor 141 provides a lower cost equivalent because arrester temperature surges are invariably caused by current surges counted by the surge counter 144. In addition to counting the total number of surge events, the surge counter 144 can discriminate between equipment related current surges, such as switching and line shorts that cause arrester temperature surges on the scale of tens of degrees, versus lightning related surges that cause arrester temperature surges on the scale of hundreds of degrees. To do so, a surge detection system utilizes an equipment surge detection temperature change threshold TS (e.g., TS=10° C.) and a lightning surge detection temperature change threshold TL (e.g., TL=100° C.). The total surge count is the number of surge detection events in which the detected temperature change is greater than TS (e.g., temp. change>10° C.). The equipment related surge count is the number of surge detection events in which the detected temperature change is greater than TS (e.g., temp. change>10° C.) and less than the TL (e.g., temp. change<100° C.). A lightning related surge count is the number of surge detection events in which the detected temperature change is greater than TL (e.g., temp. change>100° C.). The illustrated threshold temperature thresholds are merely illustrative and may vary based on the ambient conditions, the type of arrester, the type of sensor/transmitter, the operating voltage, and so forth.

Figure 15:
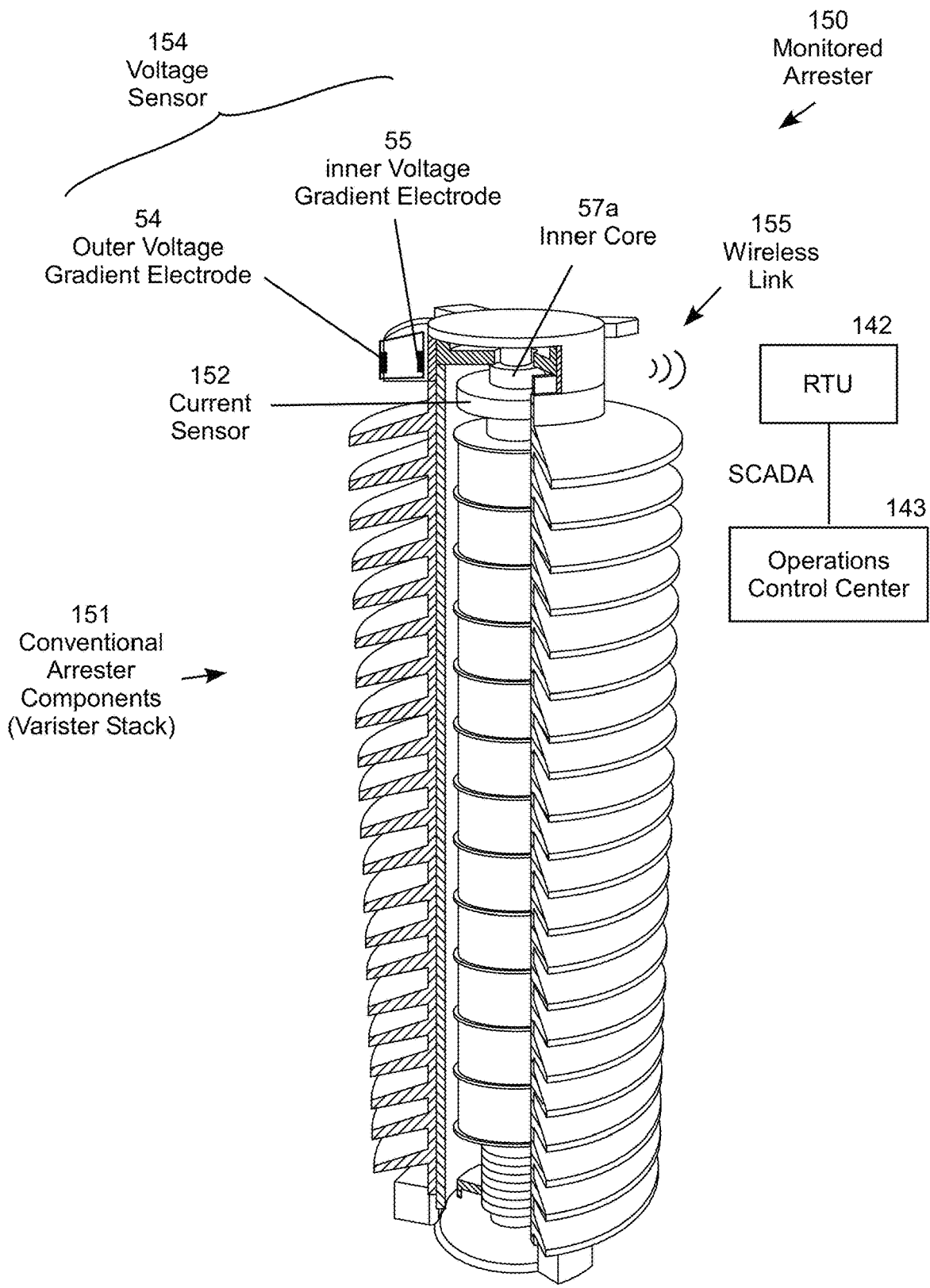
FIG. 15 is conceptual illustration of a monitored lightning arrester system using current and voltage measurements to monitor arrester impedance.

FIGS. 15-20 illustrate an alternative embodiments of another invention directed to an electric power lightning arrester performance monitoring and maintenance system utilizing arrester current and voltage measurements to detect changes in arrester impedance indicating faltering arrester performance and scheduling replacement of the faltering arrester. FIG. 15 is conceptual illustration of a monitored lightning arrester system 150 using current and voltage measurements to monitor arrester impedance. The monitored electric power arrester 150 may be essentially the same as the instrumented electric power arrester 10B shown in FIG. 5 augmented to include a current sensor 152, such as CT, Rogowski coil, Hall effect, or other suitable type of current sensor. Suitable, inexpensive current sensors are commercially available and may be developed in the future. In this particular embodiment, the current monitor is disposed around the inner core 57a inside the insulator housing 57b. This embodiment also includes a voltage sensor 154 provided by the outer and inner voltage gradient electrodes 54, 55 described previously with reference to FIG. 5. The addition of the current sensor 152 allows the arrester impedance to be computed based on real-time measurements. The computations may be performed by the RTU 142 or the Operations Control Center 143, as described previously with reference to FIG. 14, or another system component as a matter of design choice. In this particular embodiment, the current sensor 152 and the voltage sensor 154 communicate through wired or wireless data links with the RTU 142 (see, for example, the wireless transmitter shown on FIG. 3). The RTU, in turn, which communicates with the Operations Control Center 143 through wired or wireless data links, such as the Supervisory Control and Data Acquisition (SCADA) system operated by the electric utility responsible for maintaining the electric power arrester 150. Those skilled in electric utility operations will understand that the requisite computations may be performed at any suitable platform in the operations system and any suitable type of communication links may be utilized, as a matter of design choice.

Figure 16:
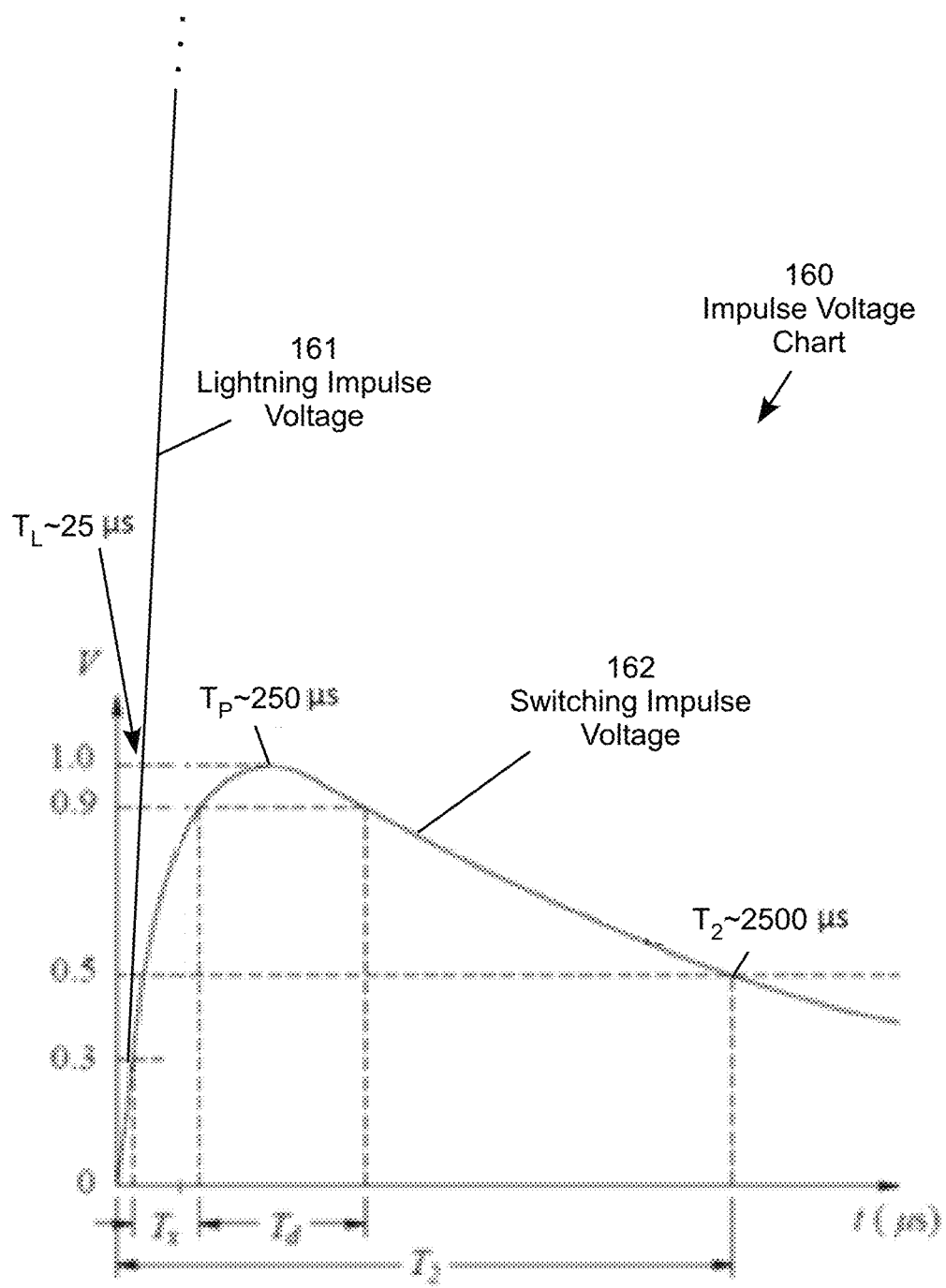
FIG. 16 is an impulse voltage chart for the lightning arrester.

FIG. 16 is an impulse voltage chart 160 for a lightning arrester plotting voltage on the y-axis as a function of time on the x-axis. The chart 160 compares a typical lightning impulse voltage 161 (lightning voltage signature) to a typical switching impulse voltage 162 (switching voltage signature). The voltage axis (y-axis) is expressed in per-unit of the peak switching impulse voltage (1.0 per-unit) while the time axis (x-axis) is expressed micro-seconds (µs). The lightning voltage signature 161 rises extremely quickly to an extremely high level in comparison to the switching voltage signature 162, with the lightning impulse voltage passing through the peak switching voltage level (i.e., 1.0 per-unit on the y-axis) during a period on the order of magnitude of 25 micro-seconds. The switching voltage signature 162 rises to its peak value (i.e., 1.0 per-unit on the y-axis) at about 250 micro-seconds, about 10-times longer than the lightning impulse 1.0 per-unit crossing (i.e., one order of magnitude longer than the lightning voltage signature 161). The switching voltage signature 162 then degrades to by half (i.e., to 0.5 per-unit on the y-axis) at about 2500 micro-seconds, which is about 100-times the lightning impulse 1.0 per-unit crossing (i.e., two orders of magnitude longer than the lightning voltage signature 161).

In addition, lightning arresters experience "noise" in voltage and current signatures due to capacitive voltage charge and leakage current due to a number of factors, such as corona capacitive discharge, internal moisture contamination, and external discharge through water, ice, fog, grime, and so forth. These naturally occurring phenomena allow the typical signature of the switching impulse voltage 162 to be conveniently distinguished from both the naturally occurring noise and the typical lightning impulse voltage. Specifically, a typical switching voltage signature 162 rises sharply well above the noise level over a period about an order of magnitude longer than the initial rise of the lightning voltage signature 161, and then degrades by half over a period about two orders of magnitude longer than the initial rise of the lightning voltage signature. These features are used to identify switching impulse voltage signatures against a background of noise and lightning impulse voltage signatures.

Figure 17:
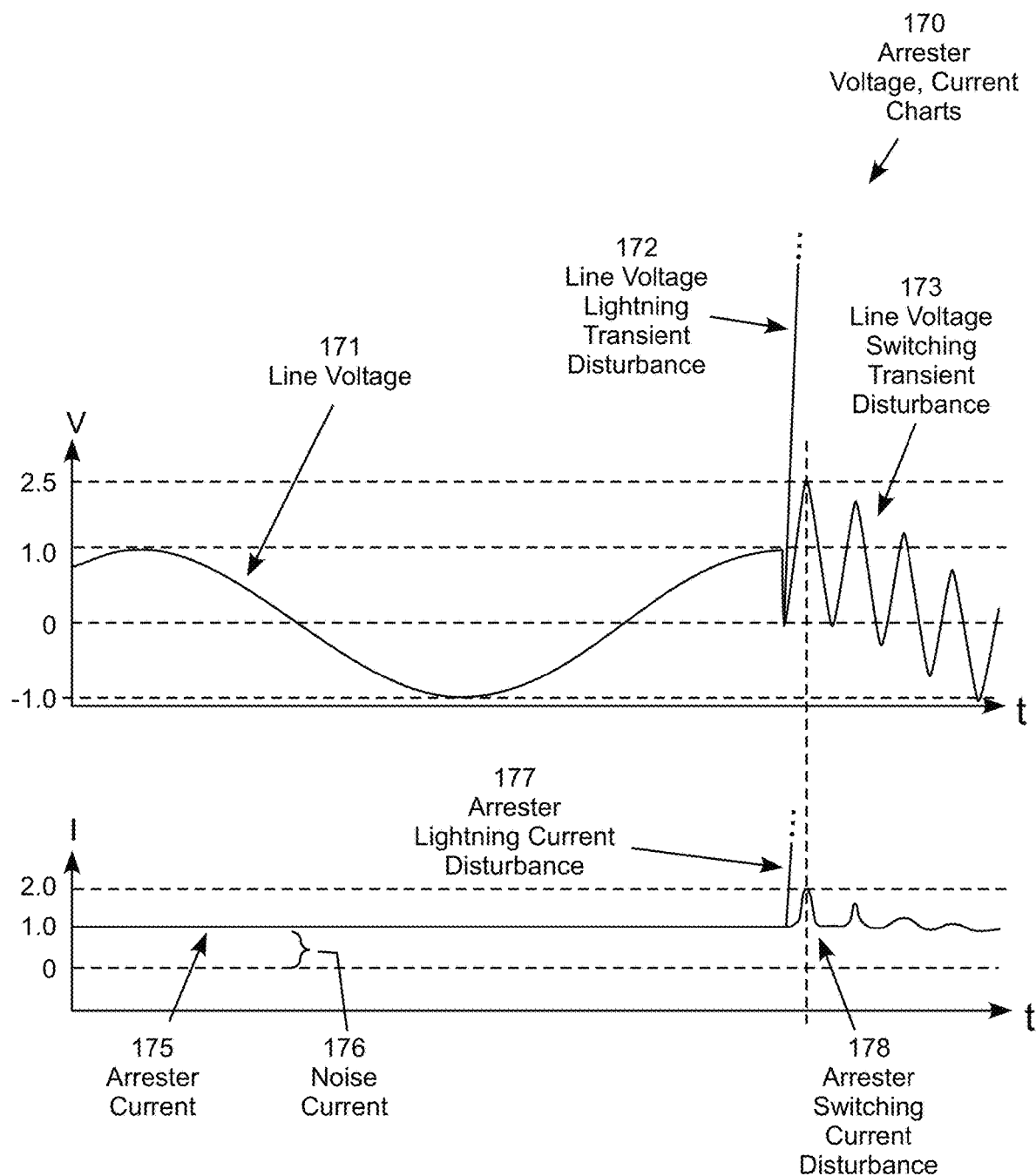
FIG. 17 includes voltage and current charts for the lightning arrester.

FIG. 17 includes voltage and current charts 170 for a lightning arrester. The upper chart depicts a nominal line voltage 171 as a function of time on a per-unit of the peak nominal voltage scale. The chart 170 compares a typical line voltage lightning transient voltage 172 (lightning voltage signature) to a typical line voltage switching transient voltage 173 (switching voltage signature). The typical lightning voltage signature 172 rises much more rapidly to a much higher value in comparison to the typical switching voltage signature 173.

The lower chart depicts a nominal arrester current 175 as a function of time on a per-unit of the noise current scale. The chart compares a typical arrester lightning current 177 (lightning current signature) to a typical arrester switching current 178 (switching current signature). The nominal arrester current 175 exhibits a noise current 176 (1.0 per-unit) prior to a lightning or switching transient disturbance. The lightning current signature 177 rises much more rapidly to a much higher value in comparison to the switching current signature 178, which rises well above the current noise level 176 to a significantly higher level, 2.0 per-unit in the illustrative example. This particular example is merely illustrative of the operational concept because, in real-world electric power systems, the switching current signature often rises to a level an order of magnitude above the current noise level.

It should be appreciated that the arresters operated by electric power distribution utilities are designed to operate as lightning shunts for protecting transformers and other system components that would otherwise be exposed to damage by lightning strikes. Although the arrester is not designed to shunt transients causes by ordinary switching operations, the inventors have discovered a naturally occurring phenomenon in which typical lightning arresters experience measurable switching voltage and current signatures that can be distinguished from the background noise and typical lightning signatures. The switching transient disturbances can therefore be monitored and used to identify faltering arresters for preventative replacement before the faltering arresters fail during lightning strikes. More specifically, as described below, the arrester voltage and current switching signatures are monitored over time and used to identify changes in the arrester impedance and breakdown voltage to detect a faltering arrester. The faltering arrested is then replaced during a fair-weather, typically off-peak period before it fails during a lightning strike, which could otherwise destroy the transformer or other equipment protected by the arrester.

Figure 18:
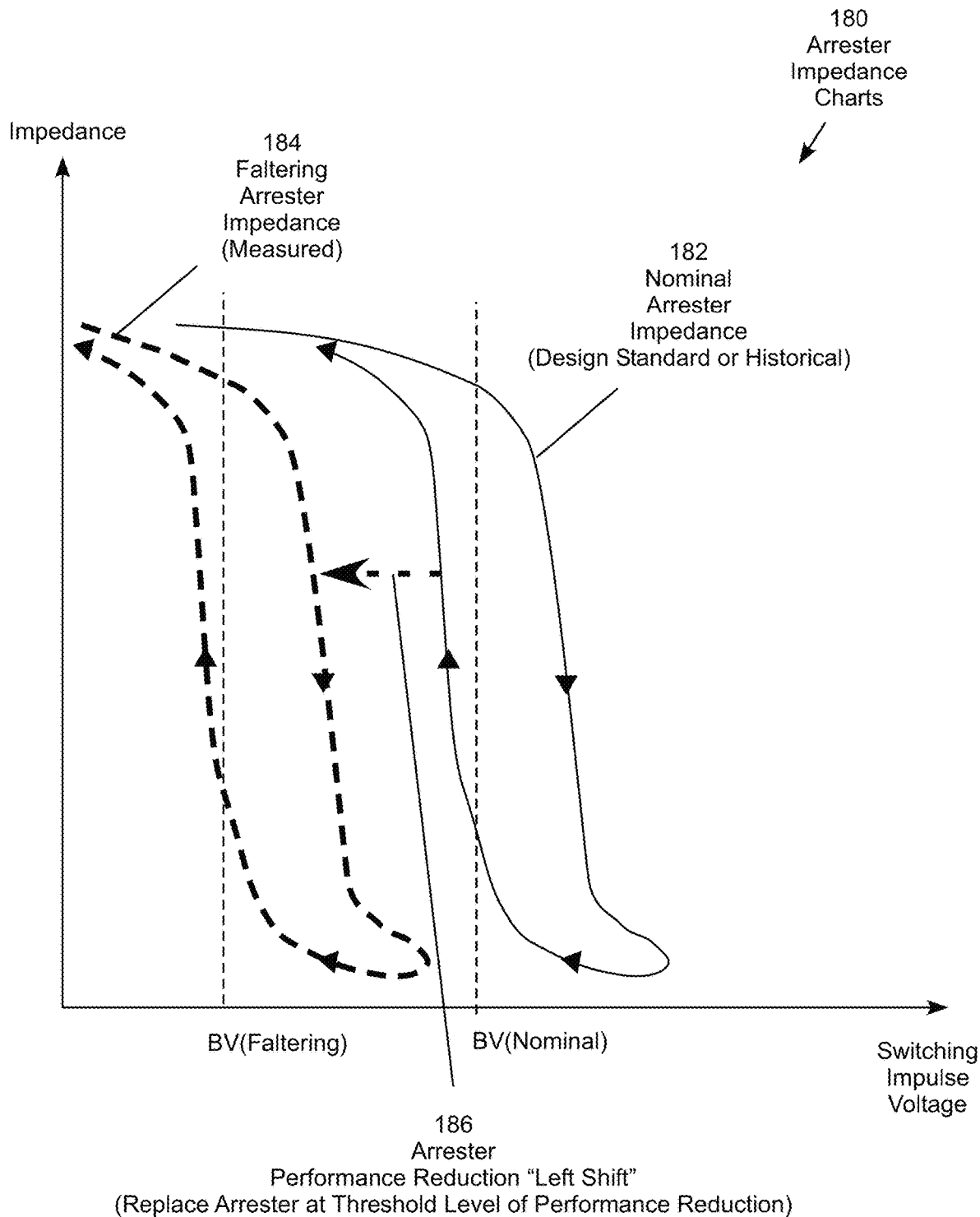
FIG. 18 includes impedance charts for the lightning arrester.

FIG. 18 includes conceptual impedance charts 180 for a lightning arrester depicting arrester impedance (y-axis) as a function of the switching impulse voltage (x-axis). The chart on the right represents a nominal arrester impedance graph 182, which can be determined based on the design performance standard or historical monitoring of the arrester from new or properly functioning condition. The chart on the left represents a faltering arrester impedance 184, which is determined from real-time monitoring of the arrester. The "left shift" 186 of the arrester impedance curve represents a significant degradation in arrester performance characterized by a reduction in the arrester impedance and breakdown voltage from the nominal breakdown "BV(Nominal)" to the falter breakdown voltage "BV(Faltering)". This indication of a faltering arrester is detected based on monitored arrester voltage and current signatures during a switching disturbance event. It will be appreciated that the "left shift" of conceptual impedance charts 180 is depicted as spaced apart impedance graphs 182, 184, while also showing them adjacent to each other, for illustrative convenience. This is merely illustrative of the operational concept because, in real-world electric power systems, the impedance signatures often vary by only a few percentage points with a threshold figure, such as a 10% "left shift" 186, indicating a faltering arrester to be scheduled for replacement during a fair-weather, typically off-peak period. The measured arrester impedance may also be adjusted (e.g., temperature normalized) based on the measured arrester temperature to remove the effect of temperature on the arrester impedance from the comparison. The nominal arrester impedance should be similarly temperature normalized for the comparison. In addition, the co-variance between the arrester temperature and the arrester impedance may be adaptively learned through arrester measurements during switching disturbance events occurring over time.

Figure 19:
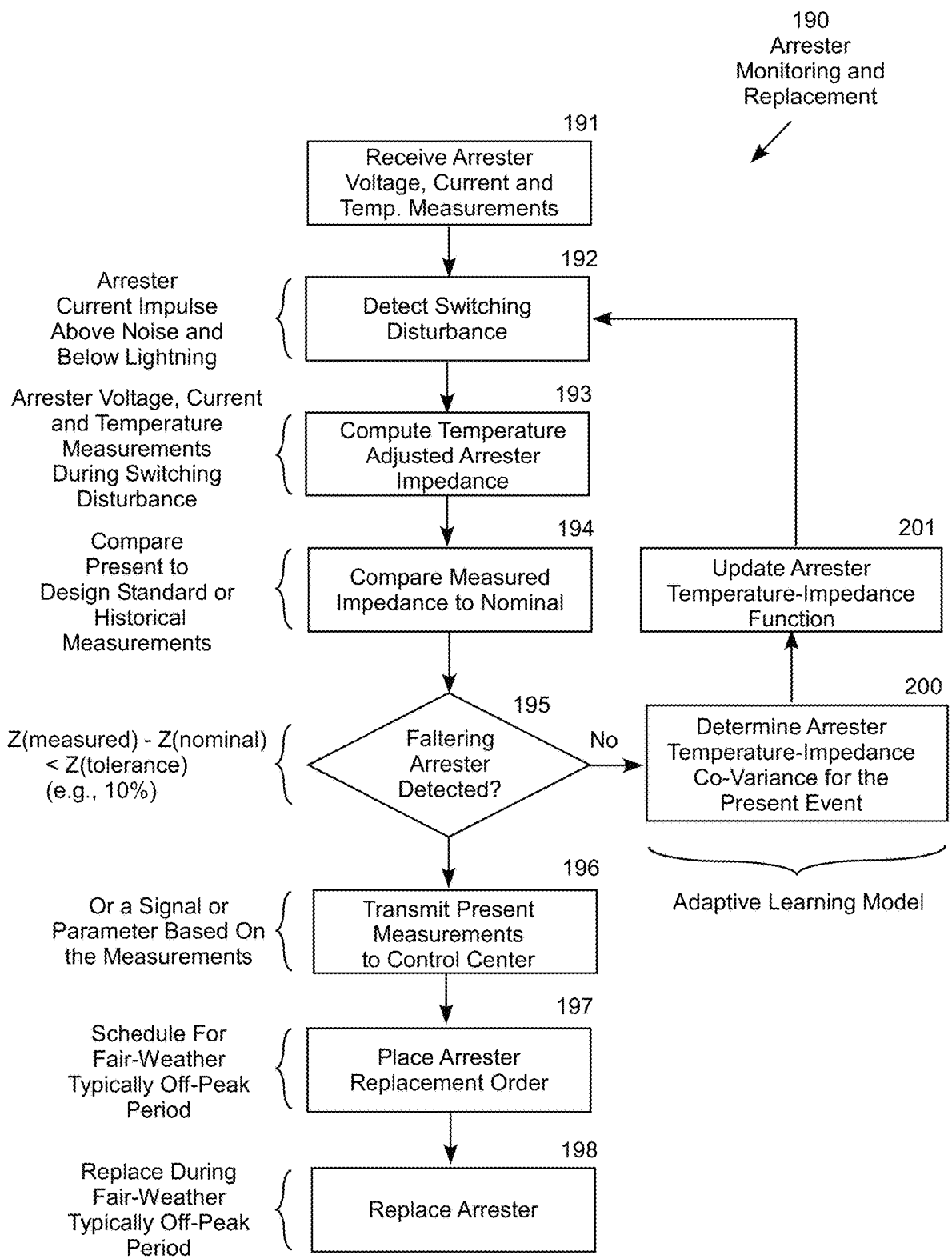
FIG. 19 is a logic flow diagram illustrating a method for monitoring and replacement of the lightning arrester.

FIG. 19 is a logic flow diagram 190 illustrating a method for monitoring and replacement of a lightning arrester. In step 191, the system receive arrester voltage, current, and temperature measurements. Step 191 is followed by step 192, in which the system the arrester monitoring and replacement system detects a switching disturbance by monitoring the line voltage and/or arrester current signals to detect arrester voltage and/or current impulse signatures well above the background noise and well below the typical lightning impulse signature, as described previously with reference to FIGS. 16 and 17. Step 192 is followed by step 193, in which the system computes the arrester impedance during the detected switching disturbance event, as described previously with reference to FIG. 18. Step 193 is followed by step 194, in which the system compares the computed arrester impedance to the nominal (e.g., designed or historical) arrester impedance, as described previously with reference to FIG. 18. Step 194 is followed by step 195, in which the system determines whether a faltering arrester has been detected, typically by comparing the reduction in the measured arrester impedance or breakdown voltage (illustrated as the "left shift" in FIG. 18) to a threshold value, such as 10%.

$$Z(\text{Measured}) - Z(\text{Nominal}) < Z(\text{Tolerance}) \text{ (e.g. 10\%)}$$

If a faltering arrester has is detected, the "yes" branch is followed from step 195 to step 196, in which the system transmits the measured arrester voltage, current, and temperature for the present switching disturbance event, or a signal or parameter based on these measurements, to the operations control center. In this example, the RTU performs the arrester impedance comparison and transmits the measured arrester voltage, current and temperature waveforms the operations control center for additional analysis and scheduling of arrester replacement. Step 196 is followed by step 197, in which the operations control center places an order for replacement of the faltering arrester. Step 197 is followed by step 198, in which a repair crew replaces the faltering arrester during a fair-weather, typically off-peak period to avoid failure of the faltering arrester during a lightning strike, which could otherwise destroy the transformer or other equipment protected by the arrester.

In addition, the impedance of a conventional zinc oxide block arrester is altered by the temperature of the arrester blocks, which can be significantly affected by the ambient temperature as well as electrical heating effects caused by lightning strikes, switching disturbances, harmonic power content, and other factors. The temperature of the arrester is therefore monitored and used to adjust (e.g., temperature normalize) the measured impedance of the arrester, prior to comparing the measured arrester impedance to the nominal arrester impedance (which should also be temperature normalized) to prevent temperature effects from masking or causing false indications of a faltering arrester. An adaptive learning temperature-impedance algorithm may be used to compute and learn the co-variance between the arrester impedance and temperature to take this factor into account, for example by accurately temperature normalizing the measured and nominal arrester impedance values, when identifying faltering arresters. To implement the adaptive learning temperature-impedance algorithm, the "no" branch is followed from step 195 to step 200, in which the system computes the arrester temperature-impedance co-variance for the present switching disturbance event. Step 200 is followed by step 201, in which the system updates the arrester temperature-impedance co-variance to take the measured co-variance for the present event into account in the adaptive learning model. Step 200 is followed by step 191, in which the system continues to monitor the arrester voltage and current.

Figure 20:
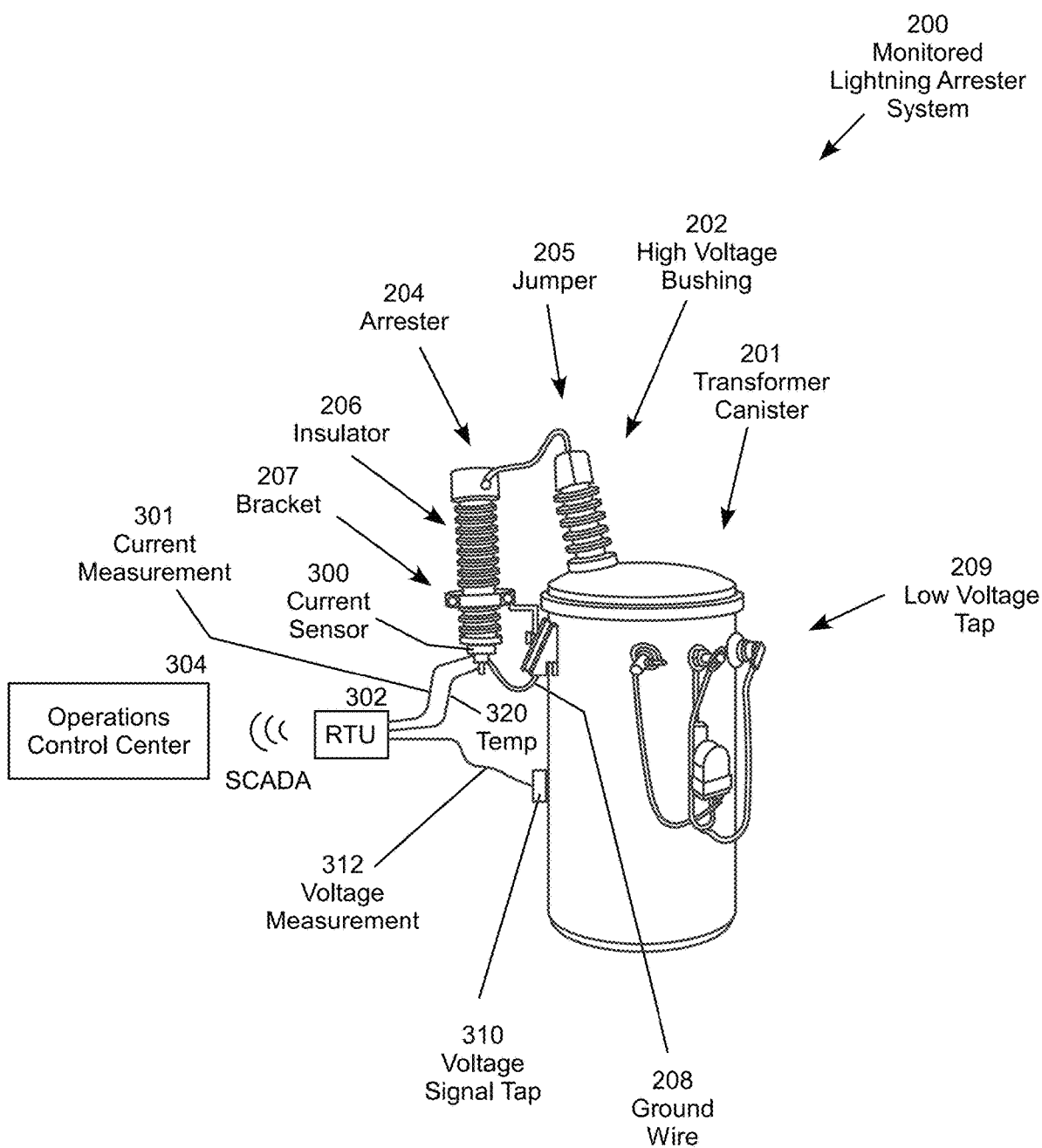
FIG. 20 is a conceptual illustration of an alternative monitored lightning arrester system connected to a distribution transformer.

FIG. 20 is a conceptual illustration of a monitored lightning arrester system 200 connected to a representative distribution transformer. This embodiment includes a transformer canister 201 containing a relatively low voltage distribution transformer (e.g., 7.2 kV-240 V). This conventional, widely utilized design includes a high voltage bushing (insulator) 202 electrically connected to a lightning arrester 204 by a jumper 205. The lightning arrester 204 includes a varistor (e.g., zinc oxide) stack inside an insulator 206, which is connected to and supported by a bracket 207 secured to and supported by the transformer canister 201. The conventional design also includes a ground wire 208 connecting and grounding the bottom, exposed portion of the center bolt of the arrester 204 to the transformer canister 201, along with a low voltage tap 209.

In this particular embodiment, the conventional distribution transformer is modified with a current sensor 300, such as a CT, Rogowski coil or Hall effect sensor, connected to the bottom, exposed portion of the center bolt of the arrester 204. The current sensor 300 is connected by a wired or wireless data link transmitting the current measurement 301 to a remote transmission unit (RTU) 302, which in turn communicates with an operations control center 304 by a wired or wireless data link (e.g., SCADA). The conventional distribution transformer is further modified with a voltage sensor, such as an internal coil pickup (typically picking up a voltage measurement from the high-voltage side of the transformer) connected to the voltage sensor signal tap 310 mounted to the exterior of the transformer canister 201. The voltage sensor signal tap 310 is connected by a wired or wireless data link transmitting the voltage measurement 312 to the RTU 302, which in turn communicates with the operations control center 304. The RTU 302 and the operations control center 304 cooperated performing the method 190 for monitoring and replacement of a lightning arrester described with reference to FIG. 19, with the processing divided as a matter of design choice.

The monitored lightning arrester system 200 may also include a temperature signal 320 transmitted to the RTU 302 through a wired or wireless communication link. For example, the temperature signal 320 may be provided by a thermocouple attached to the exposed portion of the center bolt through the arrester 204 connected by a wired connection to the RTU, as depicted in FIG. 20. Alternatively, the temperature signal 320 may generated and transmitted to the RTU using any of the previously described techniques, such as the RTD 34 shown in FIG. 4, the temperature sensor 50 shown in FIG. 5, the temperature sensor 60 shown in FIG. 6, the temperature sensor 70 shown in FIG. 7, the temperature sensor 80 shown in FIG. 8A, the temperature sensor 84 shown in FIG. 8B, the temperature sensor 92 shown in FIGS. 9-10, the RTD 116 shown n FIG. 11, or the temperature sensor 141 shown in FIG. 14. The temperature signal may be transmitted wirelessly, as depicted in FIG. 3, or through a wired connection extending out the bottom of the arrester insulator 206.

While a relatively low voltage distribution transformer (e.g., 7.2 kV-240 V) is depicted, it will be appreciated that a similar technique may be used for transformers of different voltages. In addition, while FIGS. 5 and 15 illustrate embodiments in which the surge arrester itself has been modified from the conventional design, FIG. 20 illustrates an embodiment suitable as a retrofit to a conventional distribution transformer without altering the conventional lightning arrester. It should also be appreciated that the current sensor in the embodiment illustrated in FIG. 15 is operated at the high-side of the transformer voltage (e.g., 7.2 kV for the transformer 201), whereas the current sensors 300 in the embodiment 200 illustrated in FIG. 20 is operated at the low-side of the transformer voltage (e.g., 240 V for the transformer 201), resulting in a lower cost current sensor. The trade-off is a more accurate internal temperature sensors operating at high voltage in the embodiments of FIGS. 1-15, whereas the embodiment 200 illustrated in FIG. 20 may include a less accurate temperature sensor operated at ground voltage connected to the bottom of the center bolt of the arrester 204.

The RTUs and the operations control centers described above include general purpose computer components including a processor, a computer readable storage medium storing non-transitory computer-executable instructions, and network access and management equipment that, when executed by the processor, causes the controller to perform operations described in the flow charts and elsewhere in this disclosure. The processor may be, for example, a central processing unit ("CPU"), sometimes referred to as a controller, microcontroller, processor or similar designation, together with other motherboard, computer bus, random access memory, solid state or other non-volatile memory, peripheral device drivers, and interface components typically included in general purpose, specially programmed user devices, network devices, and cloud computing platforms. A typical data processing system may be implemented utilizing any suitable commercially available components, such as those typically found in data computing and/or communication and/or network computing/communication systems. All of the technology described in this disclosure is suitable for implementation using commercially available computing devices, such as operations control centers, network servers, smartphones or personal computers. These computing devices may be interconnected via SCADA, the Internet, mobile telephone voice and data system, or other data suitable network.

The drawings are in simplified form and are not to precise scale unless specifically indicated. The words "couple" and similar terms do not necessarily denote direct and immediate connections, but also include connections through intermediate elements or devices. Certain descriptors, such "first" and "second," "top and bottom," "upper" and "lower," "inner" and "outer," or similar relative terms may be employed to differentiate structures from each other. These descriptors are utilized as a matter of descriptive convenience and are not employed to implicitly limit the invention to any particular position or orientation. It will also be understood that specific embodiments may include a variety of features and options in different combinations, as may be desired by different users. Practicing the invention does not require utilization of all, or any particular combination, of these specific features or options.

This disclosure sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components may be combined to achieve a particular functionality can be seen as "associated with" each other such that the desired functionality is achieved, irrespective of architectures or intermediate components. Likewise, any two components so associated can also be viewed as being "connected", or "coupled", to each other to achieve the desired functionality, and any two components capable of being so associated can also be viewed as being "functionally connected" to each other to achieve the desired functionality. Specific examples of functional connection include but are not limited to physical connections and/or physically interacting components and/or wirelessly communicating and/or wirelessly interacting components and/or logically interacting and/or logically interacting components.

In view of the foregoing, it will be appreciated that present invention provides significant improvements in monitoring and response systems for electric power voltage arresters. The foregoing relates only to the exemplary embodiments of the present invention, and that numerous changes may be made therein without departing from the spirit and scope of the invention as defined by the following claims.

The invention claimed is:

1. A method for monitoring an electric power lightning arrester, comprising:
   providing an arrester current sensor providing an arrester current measurement, and an arrester voltage sensor providing an arrester voltage measurement;
   detecting a switching signature based on the arrester current measurement or the arrester voltage measurement distinguished from background noise and lightning signatures;

computing a measured arrester impedance based on the arrester current and arrester voltage measurements, comparing the measured arrester impedance to a nominal or historical arrester impedance;

determining that the arrester is faltering based on the comparison of the measured arrester impedance to the nominal or historical arrester impedance;

placing an order for replacement of the arrester based on the determination that the arrester is faltering.

2. The method of claim 1, further comprising replacing the arrester during a fair-weather period to avoid failure of the arrester during a lightning strike.

3. The method of claim 1, further comprising providing the arrester current sensor within an insulator housing of the arrester.

4. The method of claim 1, further comprising providing the arrester current sensor around an inner core and within an insulator housing of the arrester.

5. The method of claim 1, further comprising providing the arrester current sensor around a central bolt and external to an insulator housing of the arrester.

6. The method of claim 1, further comprising providing the arrester voltage sensor comprising an inner voltage gradient and an outer voltage gradient electrode adjacent to an insulator housing of the arrester.

7. The method of claim 1, further comprising configuring the arrester voltage sensor to comprise a voltage sensor signal tap positioned on a canister of a transformer protected by the lightning arrester.

8. The method of claim wherein the step of determining that the arrester is faltering further comprises adjusting the measured arrester impedance based on a present arrester temperature measurement.

9. A monitored electric power lightning arrester system, comprising a lightning arrester comprising:
an arrester insulator housing;
a plurality of varister disks disposed around an inner core inside the insulator housing;
a voltage sensor disposed adjacent to the insulator housing;
a current sensor disposed around the inner core within the insulator housing;
a remote transmission unit (RTU);
one or more communication links transmitting an arrester voltage measurement from the voltage sensor, and an arrester current measurement from the current sensor, to the RTU;
an operations control center;
a communication link transmitting the arrester voltage measurement and the arrester current measurement, or a parameter based on the arrester voltage and current measurements from the RTU to the operations control center;
wherein the RTU further comprises a processor operative for:
computing a measured arrester impedance based on the arrester current and arrester voltage measurements,
comparing the measured arrester impedance to a nominal or historical arrester impedance;
transmitting the arrester current and arrester voltage measurements, the measured arrester impedance, or a parameter based on the arrester voltage and current measurements to the operations control center;
wherein the RTU or the operations control center determining that the arrester is faltering based on the comparison of the measured arrester impedance to the nominal or historical arrester impedance;
wherein the RTU or the operations control center placing an order for replacement of the arrester based on the determination that the arrester is faltering.

10. The monitored electric power lightning arrester system of claim 9, wherein the RTU is configured to determine that the arrester is faltering based on the comparison of the measured arrester impedance to the nominal or historical arrester impedance.

11. The monitored electric power lightning arrester system of claim 9, wherein the operations control center is configured to determine that the arrester is faltering based on the comparison of the measured arrester impedance to the nominal or historical arrester impedance.

12. The monitored electric power lightning arrester system of claim 9, wherein the RTU is configured to place the order for replacement of the arrester based on the determination that the arrester is faltering.

13. The monitored electric power lightning arrester system of claim 9, wherein the operations control center is configured to place the order for replacement of the arrester based on the determination that the arrester is faltering.

14. The monitored electric power lightning arrester system of claim 9, wherein the step of comparing the measured arrester impedance to a nominal or historical arrester impedance comprises adjusting the measured arrester impedance based on a present arrester temperature measurement.

15. A monitored electric power lightning arrester system comprising a lightning arrester electrically connected to a distribution transformer including a transformer located inside a transformer canister, a high voltage busing, and low voltage tap, comprising:
a jumper connecting a power line from the high voltage bushing to a high voltage end of the lightning arrester;
a current sensor connected to a low voltage end of the arrester;
a voltage sensor signal tap connected to a voltage sensor connected to a winding of the transformer;
a remote transmission unit (RTU);
one or more communication links transmitting an arrester voltage measurement from the voltage sensor, and an arrester current measurement from the current sensor, to the RTU;
an operations control center;
a communication link transmitting the arrester voltage measurement and the arrester current measurement, or a parameter based on the arrester voltage and current measurements from the RTU to the operations control center;
wherein the RTU further comprises a processor operative for:
computing a measured arrester impedance based on the arrester current and arrester voltage measurements,
comparing the measured arrester impedance to a nominal or historical arrester impedance;
transmitting the arrester current and arrester voltage measurements, the measured arrester impedance, or a parameter based on the arrester voltage and current measurements to the operations control center;
wherein the RTU or the operations control center determining that the arrester is faltering based on the comparison of the measured arrester impedance to the nominal or historical arrester impedance;
wherein the RTU or the operations control center placing an order for replacement of the arrester based on the determination that the arrester is faltering.

16. The monitored electric power lightning arrester system of claim 15, wherein the RTU is configured to determine that the arrester is faltering based on the comparison of the measured arrester impedance to the nominal or historical arrester impedance.

17. The monitored electric power lightning arrester system of claim 15, wherein the operations control center is configured to determine that the arrester is faltering based on the comparison of the measured arrester impedance to the nominal or historical arrester impedance.

18. The monitored electric power lightning arrester system of claim 15, wherein the RTU is configured to place the order for replacement of the arrester based on the determination that the arrester is faltering.

19. The monitored electric power lightning arrester system of claim 15, wherein the operations control center is configured to place the order for replacement of the arrester based on the determination that the arrester is faltering.

20. The monitored electric power lightning arrester system of claim 15, wherein the step of comparing the measured arrester impedance to a nominal or historical arrester impedance comprises adjusting the measured arrester impedance based on a present arrester temperature measurement.

\* \* \* \* \*